(12) United States Patent  (10) Patent No.: US 9,620,631 B2
Matsudai et al.  (45) Date of Patent: Apr. 11, 2017

(54) POWER SEMICONDUCTOR DEVICE

(71) Applicant: KABUSHIKI KAISHA TOSHIBA, Minato-ku, Tokyo (JP)

(72) Inventors: Tomoko Matsudai, Tokyo (JP); Tsuneo Ogura, Kanagawa-ken (JP); Yuichi Oshino, Tokyo (JP); Hideaki Ninomiya, Hyogo-ken (JP); Kazutoshi Nakamura, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 195 days.

(21) Appl. No.: 13/846,624

(22) Filed: Mar. 18, 2013

(65) Prior Publication Data

US 2014/0070266 A1  Mar. 13, 2014

(30) Foreign Application Priority Data

Sep. 12, 2012  (JP) ................................. 2012-200858

(51) Int. Cl.
*H01L 29/739* (2006.01)
*H01L 29/66* (2006.01)
(Continued)

(52) U.S. Cl.
CPC ...... *H01L 29/7397* (2013.01); *H01L 29/0626* (2013.01); *H01L 29/0688* (2013.01);
(Continued)

(58) Field of Classification Search
CPC .............. H01L 27/082; H01L 27/1022; H01L 29/0817; H01L 29/66234; H01L 29/7375;
(Continued)

(56) References Cited

U.S. PATENT DOCUMENTS 5,751,024 A * 5/1998 Takahashi ..................... 257/139
8,174,070 B2 * 5/2012 Mallikarjunaswamy H01L 21/82380
257/331
(Continued)

FOREIGN PATENT DOCUMENTS

CN 102318045 A 1/2012
CN 102376709 A 3/2012
(Continued)

OTHER PUBLICATIONS

U.S. Appl. No. 14/014,157; Tsuneo Ogura et al.; filed Aug. 29, 2013.
(Continued)

*Primary Examiner* — Mary Wilczewski
*Assistant Examiner* — Tsz Chiu
(74) *Attorney, Agent, or Firm* — Holtz, Holtz & Volek PC

(57) ABSTRACT

A power semiconductor device includes a first semiconductor layer of a first conductivity type, a second semiconductor layer of a second conductivity type, a pair of conductive bodies, a third semiconductor layer of the second conductivity type, and a fourth semiconductor layer of the first conductivity type. The second semiconductor layer is provided on the first semiconductor layer on the first surface side. The pair of conductive bodies are provided via an insulating film in a pair of first trenches extending across the second semiconductor layer from a surface of the second semiconductor layer to the first semiconductor layer. The third semiconductor layer is selectively formed on the surface of the second semiconductor layer between the pair of conductive bodies and has a higher second conductivity type impurity concentration in a surface of the third semiconductor layer than the second semiconductor layer.

19 Claims, 8 Drawing Sheets

(51) Int. Cl.
*H01L 29/02* (2006.01)
*H01L 29/78* (2006.01)
*H01L 29/40* (2006.01)
*H01L 29/47* (2006.01)
*H01L 29/08* (2006.01)
*H01L 29/868* (2006.01)
*H01L 29/06* (2006.01)
*H01L 29/36* (2006.01)

(52) U.S. Cl.
CPC ........ *H01L 29/0834* (2013.01); *H01L 29/407* (2013.01); *H01L 29/47* (2013.01); *H01L 29/868* (2013.01); *H01L 29/36* (2013.01)

(58) Field of Classification Search
CPC ......... H01L 21/02576; H01L 21/02579; H01L 27/11534; H01L 21/8228; H01L 27/0826; H01L 29/735; H01L 27/0821
USPC ........ 257/139, 143, 147, 149, 155, 172, 330
See application file for complete search history.

(56) References Cited

U.S. PATENT DOCUMENTS

| | | | |
|---|---|---|---|
| 2001/0042885 A1* | 11/2001 | Nakamura | 257/333 |
| 2002/0093049 A1* | 7/2002 | Tihanyi | H01L 29/7813 257/330 |
| 2005/0230744 A1* | 10/2005 | Wu | 257/330 |
| 2007/0108547 A1* | 5/2007 | Zhu | H01L 21/28581 257/471 |
| 2007/0158680 A1* | 7/2007 | Ozeki | H01L 27/0664 257/146 |
| 2007/0170549 A1* | 7/2007 | Tsuzuki et al. | 257/565 |
| 2009/0031150 A1 | 1/2009 | Koga | |
| 2009/0032821 A1* | 2/2009 | Onose | H01L 25/18 257/77 |
| 2009/0206913 A1 | 8/2009 | Zeng et al. | |
| 2009/0278166 A1* | 11/2009 | Soeno | H01L 27/0664 257/133 |
| 2010/0078707 A1* | 4/2010 | Haeberlen | H01L 29/7813 257/328 |
| 2010/0237457 A1* | 9/2010 | Kitagawa | 257/487 |
| 2011/0246711 A1 | 10/2011 | Koga | |
| 2012/0043581 A1 | 2/2012 | Koyama et al. | |
| 2012/0098082 A1* | 4/2012 | Hsu et al. | 257/471 |
| 2012/0146091 A1* | 6/2012 | Tanabe | H01L 29/0696 257/139 |
| 2012/0187473 A1 | 7/2012 | Zeng et al. | |
| 2013/0001639 A1* | 1/2013 | Iwasaki | H01L 21/761 257/140 |
| 2013/0056731 A1* | 3/2013 | Mauder | H01L 29/6609 257/51 |
| 2014/0231866 A1* | 8/2014 | Senoo et al. | 257/139 |

FOREIGN PATENT DOCUMENTS

| | | |
|---|---|---|
| JP | 10-69336 A | 3/1998 |
| JP | 11-204804 A | 7/1999 |
| JP | 11-274516 A | 10/1999 |
| JP | 2002-333933 A | 11/2002 |
| JP | 2007258363 A | 10/2007 |
| JP | 2008047565 A | 2/2008 |
| JP | 2008205252 A | 9/2008 |
| JP | 2009-111188 A | 5/2009 |
| JP | 2009141202 A | 6/2009 |
| JP | 2011-134861 A | 7/2011 |
| JP | 2012-019233 A | 1/2012 |

OTHER PUBLICATIONS

M. Nemoto et al. "Great improvement in IGBT Turn-on CharacteriStics with Trench Oxide PiN Schottky (TOPS) Diode", Proc. of ISPSD' 01, pp. 307-310, 2001.
Japanese Office Action dated Dec. 8, 2014 issued in counterpart Japanese Application No. 2012-200858.
Chinese Office Action (and English translation thereof) dated Oct. 26, 2015, issued in counterpart Chinese Application No. 201310070350.0.

* cited by examiner

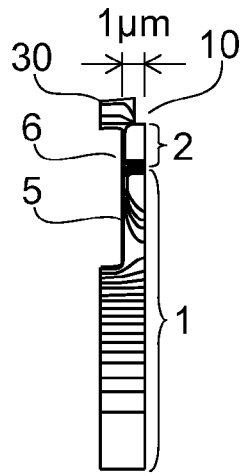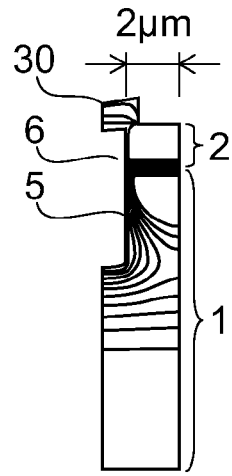
FIG. 3A     FIG. 3B
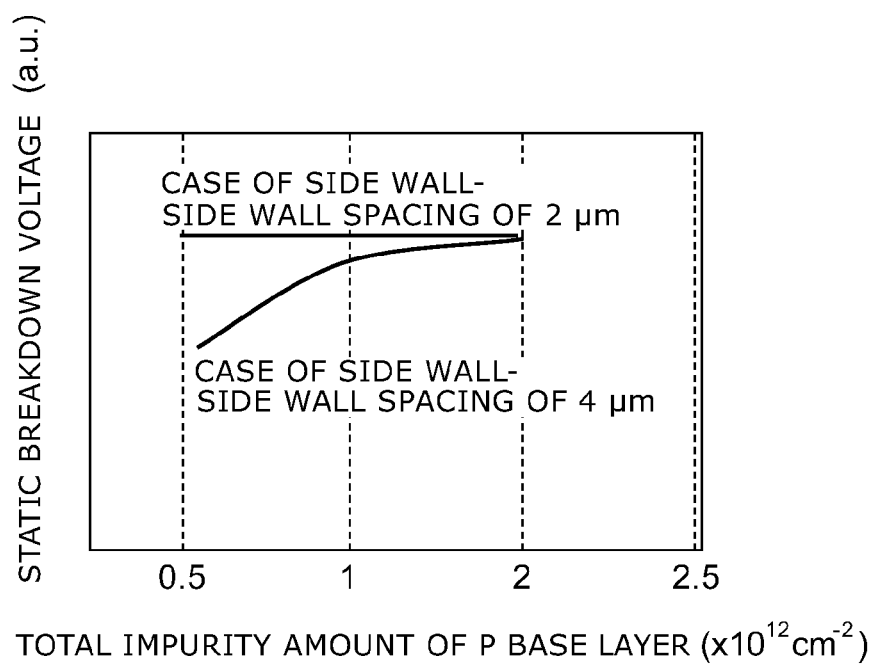
FIG. 4

POWER SEMICONDUCTOR DEVICE

CROSS-REFERENCE TO RELATED APPLICATION

This application is based upon and claims the benefit of priority from the prior Japanese Patent Application No. 2012-200858, filed on Sep. 12, 2012; the entire contents of which are incorporated herein by reference.

FIELD

Embodiments described herein relate generally to a power semiconductor device.

BACKGROUND

In an electric power converter such as an inverter, a diode called an FWD (free wheeling diode) and an IGBT (insulated gate bipolar transistor) are used in combination as a power semiconductor element. The FWD is composed of an anode layer formed of a p-type semiconductor layer, a high resistance semiconductor layer (hereinafter, an "active layer"), and a cathode layer formed of an n-type semiconductor layer. When the IGBT is switched to off, a current flowing through a load having an inductance becomes a circulating current to flow through the FWD. For the FWD, a low forward voltage and a short switching time are required. To reduce the switching time, it is necessary to improve the reverse recovery characteristics of the FWD. To this end, it is necessary to reduce the carrier concentration in the active layer of the FWD in the on-state to reduce the charge amount at the time of reverse recovery. As a means for this, a lifetime control region that shortens the lifetime of carriers is provided in the active layer in the FWD in which carriers are accumulated. The lifetime control region is a region in the active layer in which defects are produced by electron beam irradiation, proton irradiation, helium irradiation, heavy metal diffusion, or the like. The higher the density of defects is, the shorter the lifetime of carriers is. By the shortening of the lifetime of carriers, the carrier concentration in the active layer of the FWD is reduced, and the reverse recovery charge amount in the reverse recovery operation of the FWD is reduced. Therefore, reverse recovery characteristics are improved.

However, since the lifetime control layer includes a large amount of defects, there is a disadvantage that the reverse leak current of the FWD is increased due to the defects. Furthermore, it is required to downsize the package of the inverter and reduce costs by forming the FWD in the same chip as the IGBT. In this case, if a lifetime control region is formed also in the IGBT region in addition to in the FWD region, there is a disadvantage that the threshold voltage and the on-state voltage of the IGBT region are increased. Therefore, to improve the reverse recovery characteristics of the FWD, a means that takes the place of lifetime control is desired. As one of such means, the total impurity amount of the p-type region of the anode layer is reduced to reduce the hole injection into the active layer of the FWD. With a decrease in the carrier concentration of the anode region, the carrier concentration in the active layer of the FWD is reduced as in the case of using lifetime control, and the reverse recovery characteristics of the FWD can be improved. However, if the total impurity amount of the p-type region of the anode layer is excessively reduced, a depletion layer easily spreads to the anode layer side at the time of reverse bias. If a depletion layer spreads to the anode layer side to reach the anode electrode, the FWD is broken by a leak current via the interface state at the interface between the anode layer and the anode electrode. Furthermore, even if breakdown due to a leak current does not occur, local avalanche breakdown at the p-n junction between the anode layer and the cathode layer occurs to cause current concentration. Therefore, the avalanche breakdown voltage is low and the FWD is likely to be broken. It is desired to provide a low injection-type FWD with high avalanche breakdown voltage.

BRIEF DESCRIPTION OF THE DRAWINGS

FIGS. 3A and 3B are schematic cross-sectional views of a main portion showing distributions of equipotential lines of the power semiconductor device according to the first embodiment.

FIG. 4 is a graph showing relationships between the static breakdown voltage and the total impurity amount in a p base layer in the power semiconductor device according to the first embodiment.

DETAILED DESCRIPTION

Figure 1:
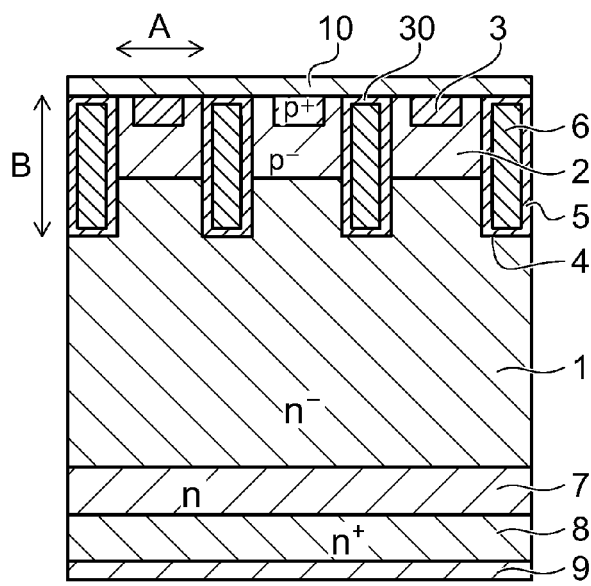
FIG. 1 is a schematic cross-sectional view of a main portion of a power semiconductor device according to a first embodiment.

According to one embodiment, a power semiconductor device includes a first semiconductor layer of a first conductivity type, a second semiconductor layer of a second conductivity type, a pair of conductive bodies, a third semiconductor layer of the second conductivity type, a fourth semiconductor layer of the first conductivity type, a first electrode, and a second electrode. The first semiconductor layer has a first surface and a second surface on an opposite side to the first surface and includes a first region in a plane parallel to the first surface. The second semiconductor layer is provided on the first semiconductor layer on the first surface side in the first region. The pair of conductive bodies are provided in a pair of first trenches extending across the second semiconductor layer from a surface of the second semiconductor layer on an opposite side to the first semiconductor layer to the first semiconductor layer. The pair of conductive bodies are adjacent to the first semiconductor layer and the second semiconductor layer via an insulating film. The third semiconductor layer is selectively formed on the surface of the second semiconductor layer on the opposite side to the first semiconductor layer between the pair of conductive bodies. The third semiconductor lyaer has a higher second conductivity type impurity concentration in a surface of the third semiconductor layer than a second conductivity type impurity concentration in the surface of the second semiconductor layer. The third semiconductor layer has a larger total second conductivity type impurity amount per unit area of the surface of the third semiconductor layer than a total second conductivity type impurity amount per unit area of the surface of the second semiconductor layer. The fourth semiconductor layer is provided on the second surface of the first semiconductor layer in the first region, is electrically connected to the second surface of the first semiconductor layer, and has a higher first conductivity type impurity concentration than the first semiconductor layer. The first electrode is provided on the pair of conductive bodies, is electrically joined to the surface of the second semiconductor layer on the opposite side to the first semiconductor layer and a surface of the third semiconductor layer on an opposite side to the first semiconductor layer, and is electrically connected to the pair of conductive bodies. The second electrode is electrically connected to the fourth semiconductor layer.

Hereinbelow, embodiments of the invention are described with reference to the drawings. The drawings used in the description of the embodiments are schematic ones for easier description; and in the actual practice, the configurations, dimensions, magnitude relationships, etc. of the components in the drawings are not necessarily the same as those illustrated in the drawings and may be appropriately altered to the extent that the effect of the invention is obtained. Although a description is given using the n-type as a first conductivity type and the p-type as a second conductivity type, the first and second conductivity types may be the respective opposite conductivity types. Although the semiconductor is described using silicon as an example, the embodiments can be applied also to compound semiconductors such as SiC and GaN. Although the insulating film is described using a silicon oxide film as an example, also other insulators such as a silicon nitride film, a silicon oxynitride film, and alumina may be used. In the case where the n conductivity type is expressed by $n^+$, n, and $n^-$, it is assumed that the n-type impurity concentration decreases in the order of $n^+>n>n^-$. Similarly, for the p-type, it is assumed that the p-type impurity concentration decreases in the order of $p^+>p>p^-$.

First Embodiment

Figure 2:
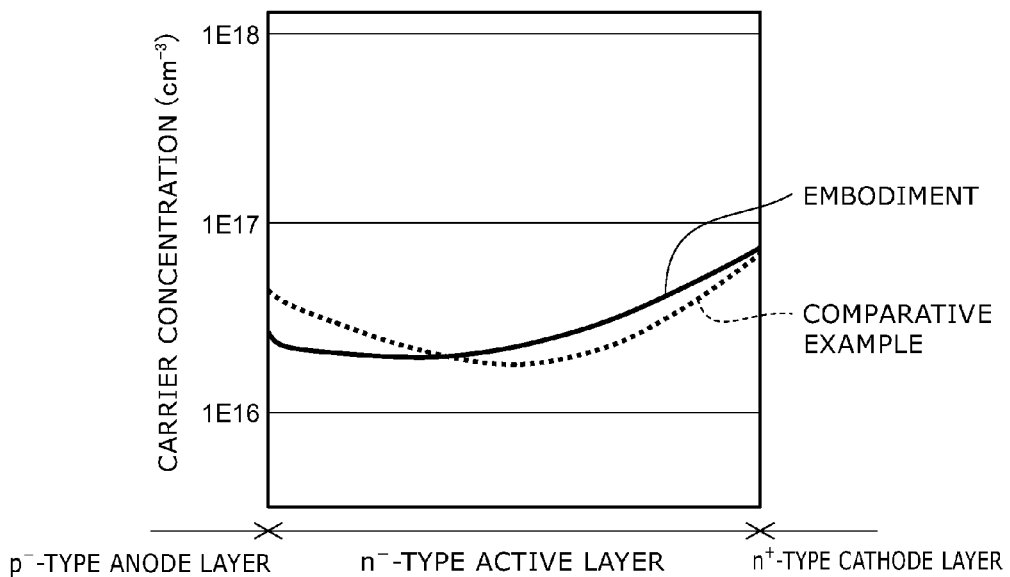
FIG. 2 is a graph showing the carrier concentration distributions in active layers of the power semiconductor device according to the first embodiment and a power semiconductor device according to a comparative example.

A power semiconductor device according to a first embodiment of the invention will now be described using FIG. 1 to FIG. 4. FIG. 1 is a schematic cross-sectional view of a main portion of the power semiconductor device according to the first embodiment. FIG. 2 is a graph showing the carrier concentration distributions in active layers of the power semiconductor device according to the first embodiment and a power semiconductor device according to a comparative example. FIGS. 3A and 3B are schematic cross-sectional views of a main portion showing distributions of equipotential lines of the power semiconductor device according to the first embodiment. FIG. 4 is a graph showing relationships between the static breakdown voltage and the total impurity amount in a p base layer in the power semiconductor device according to the first embodiment.

As shown in the cross-sectional view of a main portion of FIG. 1, the power semiconductor device according to the embodiment is a low injection-type PIN diode. The power semiconductor device according to the embodiment includes an $n^-$-type active layer 1, a p-type anode layer 2, a pair of conductive bodies 6, a $p^+$-type contact layer 3, an n-type buffer layer 7, an $n^+$-type cathode layer 8, a cathode electrode 9, and an anode electrode 10.

The $n^-$-type active layer 1 is formed by a high resistance semiconductor layer, and has a first surface that is the upper surface and a second surface that is the lower surface. The thickness of the $n^-$-type active layer 1 is determined by the breakdown voltage required for the PIN diode. The thickness of the $n^-$-type active layer 1 is set to, for example, 100 to 200 μm so that the breakdown voltage may be approximately 1200 V. The semiconductor layer is, for example, silicon (the same applies hereinafter).

The p-type anode layer 2 is provided on the first surface of the $n^-$-type active layer 1. As the p-type anode layer 2, a p-type semiconductor layer film-formed on the first surface of the $n^-$-type active layer by CVD (chemical vapor deposition) or the like may be used; but in the embodiment, the p-type anode layer 2 is a diffusion layer formed on the first surface of the $n^-$-type active layer 1 by the ion implantation and diffusion of a p-type impurity. That is, the $p^-$-type anode layer 2 extends from the first surface of the $n^-$-type active layer into the $n^-$-type active layer 1, and is formed on the $n^-$-type active layer 1 on the first surface side.

A plurality of trenches 4 are provided so as to extend from a surface of the $p^-$-type anode layer 2 on the opposite side to the $n^-$-type active layer 1 through the $p^-$-type anode layer 2 into the $n^-$-type active layer 1. The side wall-side wall spacing A of the plurality of trenches 4 (the spacing between the side walls of adjacent trenches) is, for example, 2 μm. The depth B of the plurality of trenches is, for example, 4 to 7 μm. A pair of trenches 4 sandwich the $p^-$-type anode layer 2.

An insulating film 5 is provided so as to cover the inner surface (the side surface and the bottom surface) of the plurality of trenches 4. The plurality of conductive bodies 6 are embedded in the plurality of trenches via the insulating film 5. That is, the plurality of conductive bodies 6 are provided on the $n^-$-type active layer 1 and the $p^-$-type anode layer 2 via the insulating film 5. The insulating film 5 is, for example, silicon oxide, but also silicon nitride, silicon oxynitride, or the like may be used. The conductive body 6 may be a conductive material, and is, for example, conductive polysilicon.

The $p^+$-type contact layer 3 is provided on a surface of the $p^-$-type anode layer on the opposite side to the $n^-$-type active layer 1 between a pair of trenches. The $p^+$-type contact layer 3 is, for example, a diffusion layer formed by diffusing a p-type impurity. The $p^+$-type contact layer 3 can be formed also by, for example, forming a recess in the surface of the $p^-$-type anode layer, forming a p-type semiconductor layer therein by CVD, and then planarizing the p-type semiconductor layer.

The n-type buffer layer 7 is provided on the second surface of the $n^-$-type active layer 1, and is electrically connected to the second surface of the $n^-$-type active layer 1. The n-type buffer layer 7 may be a diffusion layer in which an n-type impurity is diffused, or a region with a high n-type impurity concentration of an OSL (one side lap) substrate or an epitaxial substrate may be used as the n-tyupe buffer layer 7. The n+-type cathode layer 8 is provided on the opposite side of the n-type buffer layer 7 from the n−-type active layer 1, and is electrically connected to the n-type buffer layer 7. Also the n+-type cathode layer 8 may be, similarly to the n-type buffer layer 7, a diffusion layer in which an n-type impurity is diffused, or a region with a high n-type impurity concentration of an OSL substrate or an epitaxial substrate may be used as the n+-type cathode layer 8. The concentration of the n-type impurity of the n-type buffer layer is higher than the concentration of the n-type impurity of the n−-type active layer 1. The concentration of the n-type impurity of the n+-type cathode layer 8 is higher than the concentration of the n-type impurity of the n-type buffer layer 7.

A structure sandwiched by a pair of conductive bodies provided in the pair of trenches 4 mentioned above is defined as a unit cell, and is provided in plural on the first surface side of the n−-type active layer 1. Thereby, a diode region (a first region) is formed.

The cathode electrode 9 is electrically connected to the n+-type cathode layer 8. The anode electrode 10 is provided on the plurality of conductive bodies 6 via an interlayer insulating film 30, is electrically joined to a surface of the p−-type anode layer 2 on the opposite side to the n−-type active layer 1 and a surface of the p+-type contact layer 3 on the opposite side to the n−-type active layer 1, and is electrically connected to the plurality of conductive bodies 6. Here, the interlayer insulating film 30 on a surface of the conductive body 6 in contact with the anode electrode 10 may be removed to electrically connect the conductive body 6 and the anode electrode 10 in a direct manner. Aluminum or copper, for example, is used for the cathode electrode 9 and the anode electrode 10. Furthermore, the cathode electrode 9 can be provided on the n+-type cathode layer 8 via a burrier metal layer, and the anode electrode 10 can be provided on the p−-type anode layer 2 and the p+-type contact layer 3 via a burrier metal layer.

Thus, the power semiconductor device according to the embodiment is a PIN diode in which the diode region is formed as mentioned above. However, like examples described later, the power semiconductor device may be composed of the diode region (the first region) and a region in which another component such as an IGBT or a MOSFET is formed (a second region).

Next, operations of the PIN diode according to the embodiment are described. FIG. 2 shows a carrier concentration profile in the n−-type active layer 1 of the PIN diode according to the embodiment and a carrier concentration profile in an n−-type active layer of a PIN diode of a comparative example when the PIN diodes are in the on-state. Since the concentrations of electrons and holes are the same in the n−-type active layer because of the charge neutrality condition, the concentration profiles of them are superposed to be shown as one concentration profile.

The anode electrode 10 is lacated on the p+-type contact layer 3 and the p−-type anode layer 2 in the PIN diode according to the embodiment. Therefore, the p−-type anode layer 2 is located between the n−-type active layer 1 and the anode electrode 10 and between the n−-type active layer 1 and the p+-type contact layer 3. The anode electrode 10 is in ohmic contact with the p+-type contact layer 3. The anode electrode 10 includes aluminum. An effective surface concentration of the p-type inmpurity of the p−-type anode layer 2 is set to be equal to or less than $3\times10^{17}/cm^3$ so that the anode electrode 10 is in schottky contact with the p−-type anode layer 2.

A forward bias is applied between the anode electrode 10 and the cathode electrode 9 or a positive voltage is applied to the anode electrode 10 with respect to the cathode electrode 9. Electrons are injected from the n+-type cathode layer 8 to the n−-type active layer 1. Holes are injected from the p−-type anode layer 2 to the n−-type active layer 1. Hence, a conduction state occurs between the anode electrode 10 and the cathode electrode 9.

As mentioned above, electrons are injected from n+-type cathode layer 8 to the n−-type active layer 1. The junction between the p−-type anode layer 2 and the anode electorode 10 is not an energy-burrier to electorons. Hence, electrons injected into the n−-type active layer 1 come to the anode electrode 10 via the p−-type anode layer 2 to compose an electron current.

The junction between p−-type anode layer 2 and p+-type contact layer 3 is an energy-burrier to electorons. Hence, electrons in the p−-type anode layer 2 are prevented from coming into the p+-type contact layer 3. Electrons in the p−-type anode layer 2 move in a horizontal direction under the p+-type contact layer 3 or in another direction in a plane parrarel to the surface of the anode electrode 10.

A portion of the p−-type anode layer 2 under the p+-type contact layer 3 is forwardly biased to have an negative electric potential with respect to a portion of the p−-type anode layer 2 contacting the anode electrode 10, because of the movement of electrons in the p−-type anode layer 2 in the other direction. The bias between the portion of the p−-type anode layer 2 under the p+-type contact layer 3 and the anode electrode 10 reduces the energy-burrier to the holes between the p+-type contact layer 3 and the portion of the p−-type anode layer 2 under the p+-type contact layer 3. Hence, holes are injected from p+-type contact layer 3 into the p−-type anode layer 2. Holes injected into the p−-type anode layer 2 compose a hole current.

Such the anode electrode 10 located on the p+-type contact layer 3 and the p−-type anode layer 2 reduces the injection of holes into the n−-type active layer 1. Consequently, the carrier concentration is reduced on the p−-type anode layer 2 side in the n−-type active layer 1. This is because the injection of holes from the p−-type anode layer 2 is suppressed. In contrast, the carrier concentration increases with proximity to the n+-type cathode layer 8 side in the n−-type active layer 1. This is because electrons are injected from the n+-type cathode layer 8.

In contrast, the illustration of a detailed structure being omitted, the PIN diode of the comparative example is the same structure except that the plurality of trenches 4 and the plurality of conductive bodies 6 provided in the trenches are not provided, the concentration of the p-type impurity (or the impurity amount) of the p-type anode layer is high, and a lifetime control region that shortens the carrier lifetime is provided in the n−-type semiconductor layer.

In the PIN diode of the comparative example, the concentration of the p-type impurity of the p-type anode layer is approximately as high as the n-type impurity concentration of the n-type cathode layer; and the carrier concentration in the n−-type active layer is low near the center of the n−-type active layer because lifetime control is made, and increases with proximity to the p-type anode layer side and the n+-type cathode layer side. This is because holes are injected from the p-type anode layer 2 into the n−-type active layer in a large amount as in the case where electrons are injected from the n+-type cathode layer 8 into the n−-type active layer in a large amount. If this goes on, the carrier concentration in the n⁻-type active layer becomes excessive, and reverse recovery characteristics are degraded. Therefore, in the PIN diode of the comparative example, a lifetime control region is formed by the method described above, such as the ion implantation of helium atoms into the n⁻-type active layer. Consequently, the lifetime of carries in the n⁻-type active layer is shortened to reduce the amount of surplus carriers in the n⁻-type active layer, and reverse recovery characteristics are improved.

However, in the PIN diode of the comparative example, a large amount of crystal defects are produced when the lifetime control region is formed in the n⁻-type active layer. Due to the crystal defects, the reverse current is undesirably increased at the time of reverse voltage application in the PIN diode of the comparative example.

In contrast, the PIN diode according to the embodiment is a low injection-type PIN diode in which the concentration of the p-type impurity of the p⁻-type anode layer 2 is reduced, as described above. Therefore, even when a lifetime control region is not provided in the n⁻-type active layer 1, as shown in FIG. 2, the carrier concentration is reduced on the p⁻-type anode layer 2 side in the n⁻-type active layer 1, and the charge amount in the n⁻-type active layer 1 (the integrated value of the carrier concentration in the entire n⁻-type active layer) is almost equal to the charge amount in the n⁻-type active layer of the comparative example. Therefore, the PIN diode according to the embodiment has good reverse recovery characteristics similarly to the PIN diode of the comparative example. Furthermore, in the PIN diode according to the embodiment, since a lifetime control region is not provided in the n⁻-type active layer 1, the amount of crystal defects in the n⁻-type active layer 1 is small, and the leak current at the time of reverse bias is reduced as compared to the PIN diode of the comparative example.

However, if the p-type impurity concentration of the p⁻-type anode layer 2 is reduced, at the time of reverse bias, a depletion layer is likely to spread from the p-n junction between the p⁻-type anode layer 2 and the n⁻-type active layer toward the p⁻-type anode layer 2 side. If a depletion layer reaches the anode electrode 10, breakdown occurs at the interface between the anode electrode 10 and the p⁻-type anode layer 2. Thus, if the p-type impurity concentration of the p⁻-type anode layer 2 is reduced, the PIN diode is likely to be broken.

In the PIN diode according to the embodiment, the plurality of trenches 4 are formed so as to sandwich the p⁻-type anode layer 2 in the horizontal direction, and the plurality of conductive bodies 6 are provided in the trenches 4 via the insulating film 5. The conductive body 6 is electrically connected to the anode electrode 10 so as to be the same potential as the anode electrode 10. Therefore, when a reverse bias voltage is applied to the PIN diode, a depletion layer extends from the interface between the insulating film 5 formed on the inner surface of the trench 4 and the n⁻-type active layer 1 toward the n⁻-type active layer 1.

When the spacing between adjacent trenches 4 is sufficiently narrow, in a state where the reverse bias voltage is low, depletion layers extending from adjacent trenches are joined together, and the entire portion of the n⁻-type active layer sandwiched between the adjacent trenches 4 under the p⁻-type anode layer 2 is depleted. Even when the reverse bias voltage is further increased, little voltage is applied to the p-n junction between the p⁻-type anode layer 2 and the n⁻-type active layer 1, and most of the voltage is applied between the bottom of the trench 4 and the cathode electrode 9. Consequently, the depletion layer is likely to extend toward the n⁺-type cathode layer 8 in the n⁻-type active layer 1, and is less likely to extend toward the anode electrode 10 side in the p⁻-type anode layer 2.

FIGS. 3A and 3B show simulation results of the way in which a depletion layer of the PIN diode spreads into the n⁻-type active layer at the time of reverse bias in the case where the side wall-side wall spacing of adjacent trenches 4 is 2 μm and in the case where the side wall-side wall spacing of adjacent trenches 4 is 4 μm. FIG. 3A and FIG. 3B show half of a cross section of a unit cell having a configuration in which adjacent trenches 4 sandwich the p⁻-type anode layer 2 and the n⁻-type active layer 1. The left end of the cross-sectional view is the center of the trench of the unit cell, and the right end of the cross-sectional view is the center between adjacent trenches of the unit cell. Curved lines in the cross section show equipotential lines. Since all that is needed is to find the way of the distribution of equipotential lines spreading in the n⁻-type active layer 1 around the trench 4, the illustration of the lower portion of the n⁻-type active layer 1 is omitted. The models of the PIN diode used for the simulations of FIG. 3A and FIG. 3B are the same structure except for the spacing between adjacent trenches. These models are elements based on a breakdown voltage of 1200 V as an example, in which the thickness of the n⁻-type active layer is 100 to 200 μm, the concentration of the n-type impurity of the n⁻-type active layer is $2\times10^{13}$ to $1\times10^{14}$/cm³, the thickness of the p⁻-type anode layer is 0.5 to 3.0 μm, the surface concentration of the p-type impurity of the p⁻-type anode layer is $2\times10^{13}$ to $2\times10^{18}$/cm³, the depth of the trench is 3 to 7 μm, and the width of the trench is 0.2 to 3.0 μm. The distributions of equipotential lines are the results of simulations in which the emitter-collector voltage is set to 5 V.

As shown in FIG. 3B, in the case where the trench side wall-side wall spacing is 4 μm, most of the equipotential lines extend in the n⁻-type active layer along from the bottom to the side wall of the trench 4, and the density of equipotential lines is high around the bottom and the side wall of the trench 4 in the n⁻-type active layer 1. Consequently, most of the applied voltage is applied to the interface between the insulating film 5 of the trench 4 and the n⁻-type active layer 1 and the interface between the p⁻-type anode layer 2 and the n⁻-type active layer. Therefore, when the emitter-collector voltage is further increased, a depletion layer extends toward the anode electrode 10 in the p⁻-type anode layer 2. Thus, the PIN diode is likely to be broken.

In contrast, as shown in FIG. 3A, in the case where the trench side wall-side wall spacing is 2 μm, equipotential lines extend from the side wall of one trench 4 out of adjacent trenches 4 toward the side wall of the other trench 4, and depletion layers are joined together between the adjacent trenches 4. Consequently, as compared to the case where the trench side wall-side wall spacing is 4 μm, the density of equipotential lines is low around the bottom and the side wall of the trench in the n⁻-type active layer 1, and the spacing between equipotential lines becomes wider in the direction from the bottom of the trench 4 toward the cathode electrode. That is, most of the emitter-collector voltage is applied between the bottom of the trench 4 and the cathode electrode, and a depletion layer spreads from the bottom of the trench 4 toward the cathode layer 8 side. Consequently, the depletion layer is less likely to spread toward the anode electrode 10 in the p⁻-type anode layer 2, and therefore the breakdown of the PIN diode is suppressed even when the concentration of the p-type impurity of the p⁻-type anode layer 2 is reduced.

As described above, when the trench side wall-side wall spacing is 2 μm or less, in the PIN diode according to the embodiment, the spread of a depletion layer toward the anode electrode 10 in the p⁻-type anode layer 2 is suppressed between adjacent trenches, and therefore breakdown at the interface between the p⁻-type anode layer 2 and the anode electrode 10 is suppressed.

In a PIN diode in which, differing from the embodiment, a plurality of trenches are not formed so as to sandwich the p⁻-type anode layer 2, when the concentration of the p-type impurity (or the total impurity amount) of the p⁻-type anode layer 2 is too low, a depletion layer in the p⁻-type anode layer 2 reaches the anode electrode 10. When the total amount of the p-type impurity per unit surface area as viewed from a surface of the p⁻-type anode layer 2 on the opposite side to the n⁻-type active layer 1 (hereinafter, "the total amount of the p-type impurity per unit area") is $2 \times 10^{12}/cm^2$ or less, the depletion layer in the p⁻-type anode layer 2 reaches the anode electrode 10. In the case where the p⁻-type anode layer 2 is a diffusion layer formed by ion implantation and subsequent heat treatment, when the dose amount in the ion implantation is $2 \times 10^{12}/cm^2$ or less, the depletion layer in the p⁻-type anode layer 2 reaches the anode electrode 10.

However, breakdown does not immediately occur at the interface between the anode electrode 10 and the p⁻-type anode layer 2 even when the total amount of the impurity per unit area is the value mentioned above. When the total amount of the p-type impurity per unit area is further reduced to $1 \times 10^{12}/cm^2$ or less, breakdown occurs at the interface between the anode electrode 10 and the p⁻-type anode layer 2 of most PIN diodes.

In the PIN diode according to the embodiment, even when the concentration of the p-type impurity of the p⁻-type anode layer 2 is such a low level that the total amount of the p-type impurity per unit area has the value mentioned above, the depletion layer in the p⁻-type anode layer 2 hardly reaches the anode electrode 10. Therefore, the PIN diode according to the embodiment exhibits the effect when the total amount of the p-type impurity per unit area of the p⁻-type anode layer 2 is $2 \times 10^{12}/cm^2$ or less, and exhibits the effect more when the total amount of the p-type impurity per unit area is $1 \times 10^{12}/cm^2$ or less, which is more preferable.

In the PIN diode according to the embodiment, the p⁺-type contact layer 3 is selectively provided on a surface of the p⁻-type anode layer 2 on the opposite side to the n⁻-type active layer 1. The p⁺-type contact layer 3 is provided in order to obtain ohmic contact between the anode electrode 10 and the p⁻-type anode layer 2. The concentration of the p-type impurity of the p⁺-type contact layer 3 is much higher than the concentration of the p-type impurity of the p⁻-type anode layer 2, and is preferably, for example, $1 \times 10^{18}/cm^3$ or more, more preferably $2 \times 10^{18}/cm^3$ or more although it varies with the material of the metal used as the anode electrode 10. Thereby, the on-resistance of the PIN diode is reduced.

However, if the p⁺-type contact layer 3 is provided on the entire surface on the opposite side to the n⁻-type active layer 1 of the p⁻-type anode layer 2 sandwiched between adjacent trenches 4, the amount of holes injected into the n⁻-type active layer 1 is increased. Consequently, the effect of low injection due to a low p-type impurity concentration of the p⁻-type anode layer 2 is totally lost, and the reverse recovery characteristics of the PIN diode are degraded.

Therefore, the p⁺-type contact layer 3 may be selectively formed on the surface of the p⁻-type anode layer 2 on the opposite side to the n⁻-type active layer 1. Thereby, the low injection effect due to a low p-type impurity concentration of the p⁻-type anode layer 2 and the effect of operating voltage reduction due to the p⁺-type contact layer 3 are simultaneously obtained.

Although the depth of the trench is set to 3 to 7 μm in the PIN diode according to the embodiment, it is sufficient that $A/B \leq 0.5$ be satisfied, where A is the side wall-side wall spacing of the trench 4 and B is the depth of the trench 4. Under this condition, since the n⁻-type active layer under the p⁻-type anode layer 2 is depleted between adjacent trenches 4, the possibility is reduced that the depletion layer in the p⁻-type anode layer 2 will reach the anode electrode 10.

In the foregoing, the cases where the trench side wall-side wall spacing is 2 μm and 4 μm are used as examples for description. Next, FIG. 4 shows a graph of simplified relationships between the total impurity amount of the p⁻-type anode layer and the static breakdown voltage, with the former on the horizontal axis and the latter on the vertical axis. The static breakdown voltage is the breakdown voltage when a reverse bias is applied between emitter and collector. In the case where the trench side wall-side wall spacing is 4 μm, a depletion layer extends toward the anode electrode 10 in the p⁻-type anode layer 2 when the emitter-collector voltage is increased. Therefore, in general, the PIN diode is likely to be broken when the total amount of the p-type impurity per unit area is $1 \times 10^{12}/cm^2$ or less.

On the other hand, in the case where the trench side wall-side wall spacing is 2 μm, depletion layers are joined together between adjacent trenches 4 when the emitter-collector voltage is increased. In other words, even when the total impurity amount of the p⁻-type anode layer 2 is decreased, the p⁻-type anode layer 2 is not depleted, and the static breakdown voltage is kept.

Therefore, as shown in FIG. 4, in the case where the trench side wall-side wall spacing is 4 μm, a decrease in the static breakdown voltage is seen when the total amount of the p-type impurity is $1 \times 10^{12}/cm^2$ or less; on the other hand, in the case where the trench side wall-side wall spacing is 2 μm, the p⁻-type anode layer 2 is not depleted and the static breakdown voltage is kept even when the total amount of the p-type impurity is $1 \times 10^{12}/cm^2$ or less.

Next, these relationships are studied as the value of A/B, where B is the depth of the trench and A is the side wall-side wall spacing of the trench 4. For example, in a range of A/B 0.5 in the case of $5 \times 10^{11}/cm^2$, when the emitter-collector voltage is increased, depletion layers are joined together between adjacent trenches 4; and even when the total impurity amount of the p⁻-type anode layer is decreased, the p⁻-type anode layer 2 is not depleted and the static breakdown voltage is kept. On the other hand, in a range of A/B>0.5, when the emitter-collector voltage is increased, a depletion layer extends toward the anode electrode 10 in the p⁻-type anode layer 2. In other words, in the case where the total amount of the p-type impurity is $1 \times 10^{12}/cm^2$ or less, for example $5 \times 10^{11}/cm^2$, an appropriate structure in which the static breakdown voltage is kept is obtained in the range of $A/B \leq 0.5$.

Thus, in the PIN diode according to the embodiment, the plurality of trenches 4 are formed so as to sandwich the p⁻-type anode layer 2, and the plurality of conductive bodies 6 are provided in the trenches 4 via the insulating film 5. The conductive body 6 is electrically connected to the anode electrode 10 so as to be the same potential as the anode electrode 10. Therefore, when a reverse bias voltage is applied to the PIN diode, a depletion layer extends from the interface between the insulating film 5 formed on the inner surface of the trench 4 and the n⁻-type active layer 1 toward the n⁻-type active layer 1, and depletion layers extending from adjacent trenches 4 are joined together. Thereby, the depletion layers are joined together in the portion of the n⁻-type active layer sandwiched between the adjacent trenches 4 under the p—type anode layer 2. The depletion layer is likely to extend toward the n⁺-type cathode layer 8 in the n⁻-type active layer 1, and is less likely to extend toward the anode electrode 10 side in the p⁻-type anode layer 2. Consequently, the possibility is reduced that the depletion layer in the p⁻-type anode layer 2 will reach the anode electrode. Thus, a low injection-type PIN diode having high breakdown withstand capability in which the concentration of the p-type impurity of the p⁻-type anode layer 2 is reduced can be provided.

Second Embodiment

Figure 5:
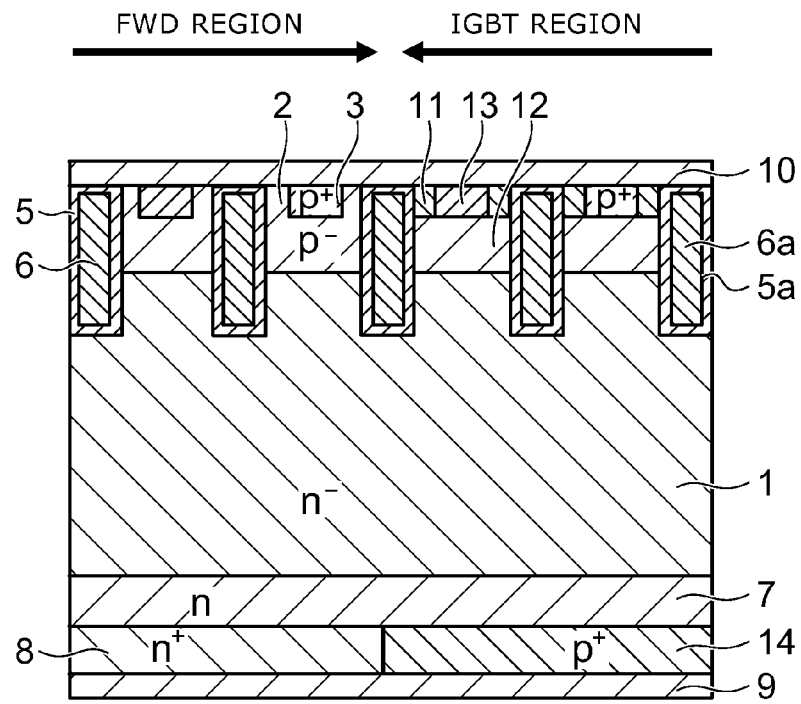
FIG. 5 is a schematic cross-sectional view of a main portion of a power semiconductor device according to a second embodiment.
Figure 6:
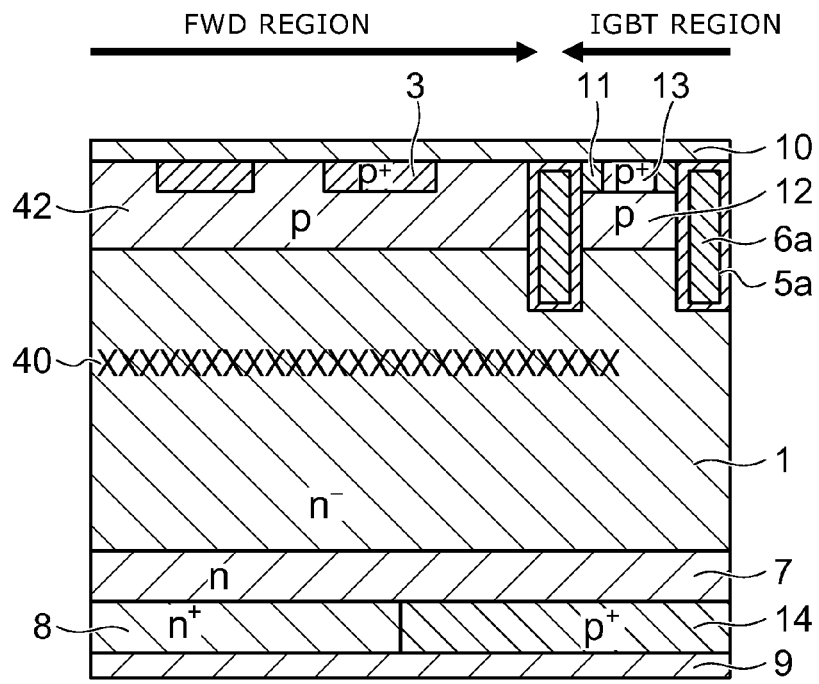
FIG. 6 is a schematic cross-sectional view of a main portion of a power semiconductor device according to a comparative example.

A power semiconductor device according to a second embodiment will now be described using FIG. 5 and FIG. 6. FIG. 5 is a schematic cross-sectional view of a main portion of the power semiconductor device according to the second embodiment. FIG. 6 is a schematic cross-sectional view of a main portion of a power semiconductor device according to a comparative example. Components of the same configuration as the configuration described in the first embodiment are marked with the same reference numerals or symbols, and a description thereof is omitted. Differences from the first embodiment are mainly described.

As shown in FIG. 5, the power semiconductor device according to the embodiment includes an FWD region in which a plurality of unit cells of an FWD are formed and an IGBT region in which a plurality of unit cells of an IGBT are formed. The FWD formed in the FWD region is the PIN diode according to the first embodiment. That is, the power semiconductor device according to the embodiment includes the PIN diode according to the first embodiment in the FWD region. The power semiconductor device according to the embodiment differs from the first embodiment in respect of further including the IGBT region.

In the power semiconductor device according to the embodiment, the n⁻-type active layer 1 includes the FWD region (the first region) and the IGBT region (the second region) adjacent thereto in a plane parallel to the first surface, which is the upper surface, or the second surface, which is the lower surface (in a horizontal plane). The structure of the FWD region is the same as that of the first embodiment, and therefore the structure of the IGBT region is described.

In the IGBT region, a p-type base layer 12 is provided on the n⁻-type active layer 1 on the first surface side of the n⁻-type active layer 1, and has a higher p-type impurity concentration (and a higher total impurity amount, the same applies hereinafter) than the p⁻-type anode layer 2 in the FWD region. In other words, the p-type base layer 12 is provided on the first surface side of the n⁻-type active layer, and has a higher p-type impurity concentration than the p⁻-type anode layer 2 in the FWD region. The p-type base layer 12 is a diffusion layer in which a p-type impurity is diffused similarly to the p⁻-type anode layer 2, but may be a p-type semiconductor layer formed by burying a p-type semiconductor by CVD in a recess provided in the surface of the n⁻-type active layer 1 and then planarizing the p-type semiconductor.

An n⁺-type emitter layer 11 is provided on a surface of the p-type base layer 12 on the opposite side to the n⁻-type active layer, and has a higher n-type impurity concentration than the n⁻-type active layer 1. The n⁺-type emitter layer 11 is a diffusion layer in which an n-type impurity is diffused, but may be an n⁺-type semiconductor layer formed by burying an n-type semiconductor by CVD in a recess formed in the surface of the p-type base layer 12 and then planarizing the n-type semiconductor.

A plurality of trenches 4a are provided so as to extend from a surface of the n⁺-type emitter layer 11 on the opposite side to the n⁻-type active layer 1 through the p-type base layer 12 into the n⁻-type active layer 1. A gate insulating film 5a is provided so as to cover the inner surface (the side surface and the bottom surface) of the trench 4a. The gate insulating film 5a is, for example, silicon oxide similarly to the insulating film 5, but may be silicon nitride or silicon oxynitride.

The p-type base layer 12 mentioned above may be provided at the same depth as the p⁻-type anode layer 2 in the FWD region, or may be provided shallower or deeper. A concentration profile is set in accordance with the characteristics of the IGBT and the FWD, particularly so as to obtain a desired threshold. The depth of the plurality of trenches 4a in the IGBT region mentioned above may be the same as or different from the depth of the plurality of trenches 4 in the FWD region. When the depths of both are the same, the trenches 4 in the FWD region and the trenches 4a in the IGBT region can be collectively formed, and therefore manufacturing efficiency is enhanced.

A gate electrode 6a is provided in the trench 4a via the gate insulating film 5a. The gate electrode 6a may be a conductive material similarly to the conductive body 6, and is, for example, conductive polysilicon. The gate electrode 6a is provided on the n⁻-type active layer 1, the p-type base layer 12, and the n⁺-type emitter layer 11 via the gate insulating film 5a in the trench 4a. The interlayer insulating film 30 is provided on the gate electrode 6a. The interlayer insulating film 30 is, for example, silicon oxide similarly to the gate insulating film 6a, but may be silicon nitride or silicon oxynitride.

A p⁺-type contact layer 13 is provided on a surface of the p-type base layer 12 on the opposite side to the n⁻-type active layer 1, and is adjacent to the n⁺-type emitter layer 11. The p⁺-type contact layer 13 is a diffusion layer in which a p-type impurity is diffused, but may be a p⁺-type semiconductor layer formed by burying a p-type semiconductor by CVD in a recess formed in the surface of the p-type base layer 12 and then planarizing the p-type semiconductor.

A p⁺-type collector layer 14 is provided on a surface of the n-type buffer layer 7 on the opposite side to the n⁻-type active layer 1. The p⁺-type collector layer 14 is adjacent to the n⁺-type cathode layer 8, and is a diffusion layer in which a p-type impurity is diffused. The p⁺-type collector layer 14 may be also a p⁺-type semiconductor layer formed by a method in which an opening is formed in the n⁺-type cathode layer 8 so as to reach the n-type buffer layer 7, a p-type semiconductor is buried in the opening by CVD, and then the p-type semiconductor is planarized.

The cathode electrode 9 is formed on the n⁺-type cathode layer 8 in the FWD region to be electrically connected to the n⁺-type cathode layer 8, and is formed on the p⁺-type collector layer 14 in the IGBT region to be electrically connected to the p⁺-type collector layer 14. That is, the cathode electrode 9 in the FWD region extends into the IGBT region, and functions as a collector electrode 9 in the IGBT region.

The anode electrode 10 is formed on the p⁻-type anode layer 2 and on the p⁺-type contact layer 3 in the FWD region to be electrically connected to the p⁻-type anode layer 2 and the p$^+$-type contact layer 3, and is formed on the gate electrode 6a via the interlayer insulating film 30 in the IGBT region to be electrically connected to a surface of the p-type base layer 12 on the opposite side to the n$^-$-type active layer 1 and a surface of the p$^+$-type contact layer 13 on the opposite side to the n$^-$-type active layer 1. That is, the anode electrode 10 in the FWD region extends into the IGBT region, and functions as an emitter electrode in the IGBT region.

A structure in which the pair of adjacent trenches 4a mentioned above sandwich the n$^-$-type active layer 1, the p$^-$-type base layer 12, the n$^+$-type emitter layer 11, and the p$^+$-type contract layer 13 forms a unit cell of an IGBT. In the IGBT region, a plurality of unit cells thus configured are formed on the first surface side of the n$^-$-type active layer 1 to form the IGBT. The n$^-$-type active layer 1 functions as an n$^-$-type base layer 1 in the IGBT region.

The power semiconductor device according to the embodiment includes the FWD and the IGBT as mentioned above. The anode electrode 10 of the FWD is formed in common with the emitter electrode 10 of the IGBT, and the cathode electrode 9 of the FWD is formed in common with the collector electrode 9 of the IGBT. Thus, the FWD is connected in antiparallel to the IGBT, and the power semiconductor device according to the embodiment forms an RC (reverse conducting)-IGBT.

The RC-IGBT according to the embodiment operates as follows. When a voltage exceeding the threshold is applied to the gate electrode 6a of the IGBT, a channel layer is formed in a portion opposed to the gate electrode 6a of the p-type base layer 12, and the IGBT of the RC-IGBT is switched to the on-state. Consequently, a current flows through the IGBT from the collector electrode 9 toward the emitter electrode 10. When the voltage application to the gate electrode 6a is stopped, the channel disappears and the IGBT is switched to the off-state. At this time, when a positive voltage with respect to the collector electrode 9 is applied to the emitter electrode 10, the FWD becomes to be forward biased into the on-state, and a current flows from the anode electrode 10 toward the cathode electrode 9. When the RC-IGBT is used as a switch element of an inverter, the FWD passes a circulating current in this way.

Also in the RC-IGBT according to the embodiment, the FWD formed in the FWD region has the same effects as the PIN diode according to the first embodiment. That is, in the FWD formed in the FWD region of the RC-IGBT according to the embodiment, the plurality of trenches 4 are formed so as to sandwich the p$^-$-type anode layer 2, and the plurality of conductive bodies 6 are provided in the trenches 4 via the insulating film 5. The conductive body 6 is electrically connected to the anode electrode 10 so as to have the same potential as the anode electrode 10. Therefore, when a reverse bias voltage is applied to the PIN diode, a depletion layer extends from the interface between the insulating film 5 formed on the inner surface of the trench 4 and the n$^-$-type active layer 1 toward the n$^-$-type active layer 1, and depletion layers extending from adjacent trenches 4 are joined together. Thereby, the entire portion of the n$^-$-type active layer sandwiched between the adjacent trenches 4 under the p$^-$-type anode layer 2 is depleted.

The depletion layer is likely to extend toward the n$^+$-type cathode layer 8 in the n$^-$-type active layer 1, and is less likely to extend toward the anode electrode 10 side in the p$^-$-type anode layer 2. Consequently, the possibility is reduced that the depletion layer in the p$^-$-type anode layer 2 will reach the anode electrode. Thus, a low injection-type PIN diode having high breakdown withstand capability in which the concentration of the p-type impurity of the p$^-$-type anode layer 2 is reduced can be provided.

Furthermore, the power semiconductor device according to the embodiment has a feature in that the IGBT and the FWD according to the first embodiment are collectively formed. The advantage of this will now be described with comparison to a power semiconductor device according to a comparative example.

FIG. 6 shows an RC-IGBT according to the comparative example. The RC-IGBT according to the comparative example includes the PIN diode of the comparative example that is compared in the first embodiment in the FWD region. The IGBT region of the RC-IGBT according to the comparative example includes an IGBT of the same structure as the IGBT of the RC-IGBT according to the embodiment. That is, a p-type anode layer 42 of an FWD of the RC-IGBT according to the comparative example has a higher p-type impurity concentration than the p$^-$-type anode layer 2 of the FWD of the RC-IGBT according to the embodiment. A plurality of trenches extending from a surface of the p-type anode layer 42 on the opposite side to the n$^-$-type active layer 1 through the p$^-$-type anode layer into the n$^-$-type active layer 1 are not provided in the FWD region. Furthermore, a lifetime control region formed by He irradiation or the like is provided on the anode side or the cathode side of the n$^-$-type active layer in the FWD region or in a middle region of the n$^-$-type active layer, and such a lifetime control region is not provided in the IGBT region. In the above respects, the FWD in the RC-IGBT according to the comparative example differs from the FWD in the RC-IGBT according to the embodiment.

In the FWD in the RC-IGBT according to the comparative example, the lifetime control region is used to reduce the carrier concentration in the n$^-$-type active layer 1 to improve reverse characteristics. However, crystal defects in the n$^-$-type active layer 1 due to the lifetime control region increase the leak current at the time of the reverse bias of the FWD. The lifetime control region is selectively provided in the FWD region, and is not provided in the IGBT region. However, for example, since the steepness in the in-plane direction of the helium irradiation and the accuracy of a mask used in the helium irradiation are not sufficient, the lifetime control region is formed so as to enter the IGBT region. As a result, the on-voltage is increased in a region of the IGBT region where lifetime control is made.

In contrast, the RC-IGBT according to the embodiment improves the reverse recovery characteristics of the FWD without including a lifetime control region in the FWD region, as described above. Therefore, the IGBT in the RC-IGBT according to the embodiment has a low on-voltage and can suppress non-uniform operations in the IGBT region, as compared to the IGBT in the RC-IGBT according to the comparative example.

The power semiconductor device according to the embodiment is an RC-IGBT including the FWD region, which is the first region, and the IGBT region, which is the second region. The embodiment is not limited thereto, and can be applied also to a power semiconductor device that includes a MOSFET region formed of a MOSFET (metal oxide semiconductor field effect transistor) in place of the IGBT region. In this case, instead of the p$^+$-type collector layer 14, the n$^+$-type cathode layer 8 in the first region extends to the second region and is provided between the collector electrode 9 and the n$^-$-type base layer 1. The collector electrode 9 is electrically connected to the n$^-$-type base layer 1 via the n$^+$-type cathode layer 8.

Third Embodiment

Figure 7:
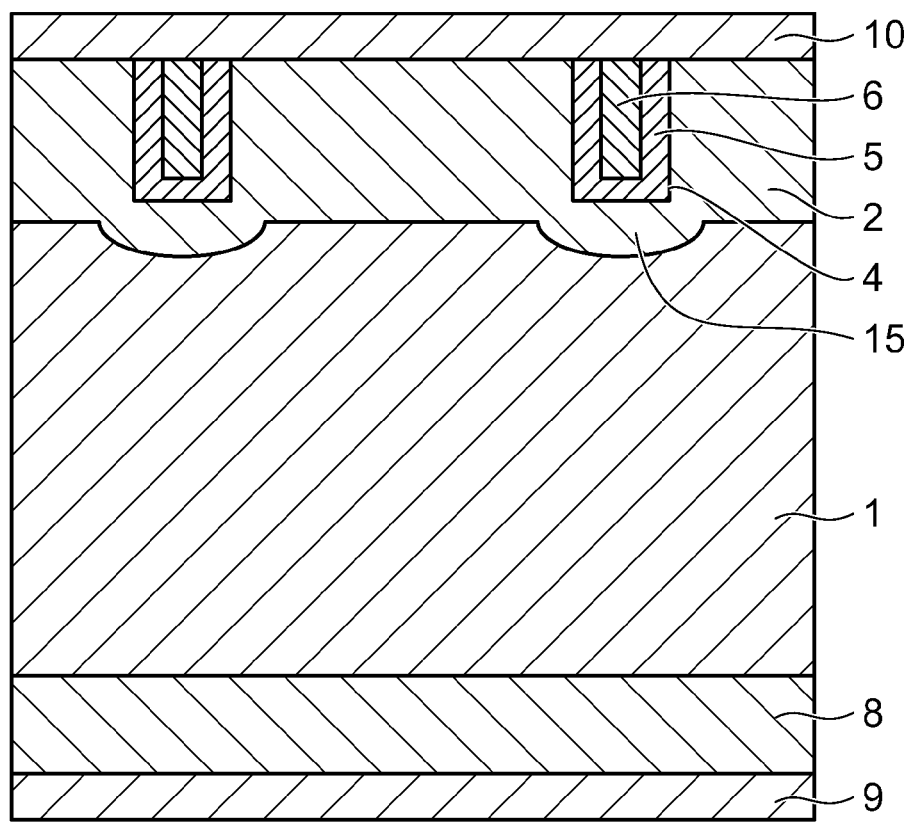
FIG. 7 is a schematic cross-sectional view of a main portion of a power semiconductor device according to a third embodiment.
Figure 8A:
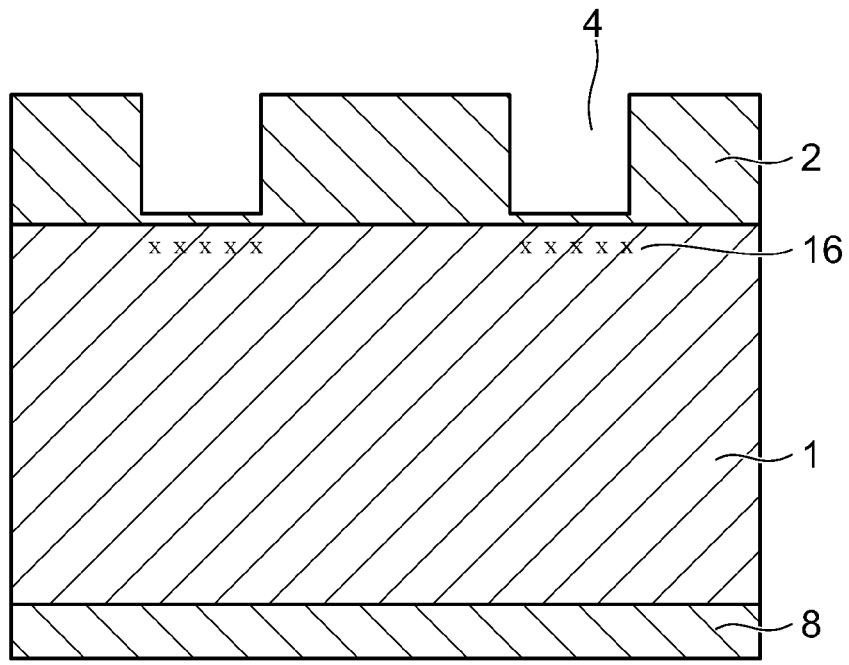
FIGS. 8A and 8B are schematic cross-sectional views of a main portion showing part of the manufacturing processes of the power semiconductor device according to the third embodiment.
Figure 8B:
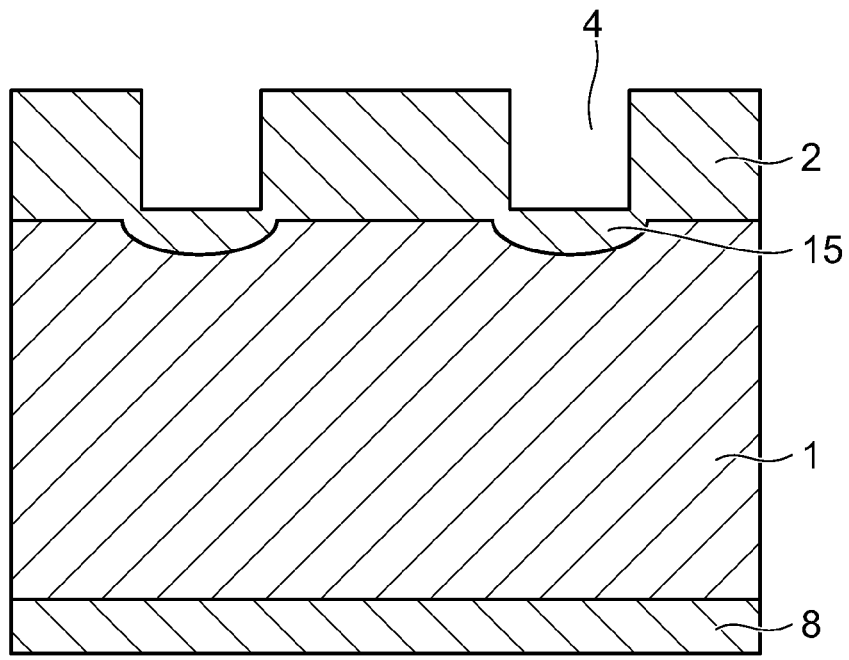
Figure 9:
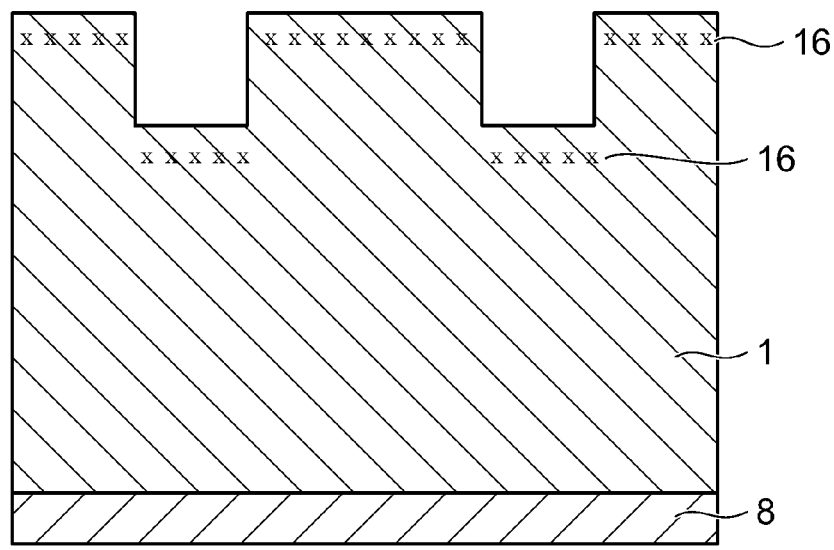
FIG. 9 is a schematic cross-sectional view of a main portion showing part of another type of manufacturing processes of the power semiconductor device according to the third embodiment.

A power semiconductor device according to a third embodiment will now be described using FIG. 7 to FIG. 9. FIG. 7 is a schematic cross-sectional view of a main portion of the power semiconductor device according to the third embodiment. FIGS. 8A and 8B are schematic cross-sectional views of a main portion showing part of the manufacturing processes of the power semiconductor device according to the third embodiment. FIG. 9 is a schematic cross-sectional view of a main portion showing part of another type of manufacturing processes of the power semiconductor device according to the third embodiment. Components of the same configuration as the configuration described in the first embodiment are marked with the same reference numerals or symbols. Differences from the first embodiment are mainly described.

As shown in FIG. 7, the power semiconductor device according to the embodiment is a PIN diode similarly to the first embodiment, and includes the $n^-$-type active layer 1, the p-type anode layer 2, the plurality of conductive bodies 6, a $p^+$-type diffusion layer 15, the $n^+$-type cathode layer 8, the cathode electrode 9, and the anode electrode 10.

The $n^-$-type active layer 1 is formed by a high resistance semiconductor layer, and has the first surface, which is the upper surface, and the second surface, which is the lower surface. The thickness of the $n^-$-type active layer 1 is determined by the breakdown voltage required for the PIN diode. The thickness of the $n^-$-type active layer 1 is set to, for example, 100 to 200 μm so that the breakdown voltage may be approximately 1200 V. The semiconductor layer is, for example, silicon (the same applies hereinafter).

The p-type anode layer 2 is provided on the first surface of the $n^-$-type active layer 1. As the p-type anode layer 2, a p-type semiconductor layer film-formed on the first surface of the $n^-$-type active layer by CVD or the like may be used; but in the embodiment, the p-type anode layer 2 is a diffusion layer formed on the first surface of the $n^-$-type active layer 1 by the diffusion of a p-type impurity. That is, the $p^-$-type anode layer 2 extends from the first surface of the $n^-$-type active layer into the $n^-$-type active layer 1, and is formed on the $n^-$-type active layer 1 on the first surface side.

The plurality of trenches 4 are provided so as to extend from a surface of the $p^-$-type anode layer 2 on the opposite side to the $n^-$-type active layer 1 into the $p^-$-type anode layer 2. The side wall-side wall spacing A of the plurality of trenches 4 is, for example, 2 μm. The depth of the plurality of trenches 4 is, for example, 5 μm. A pair of trenches 4 sandwich the $p^-$-type anode layer 2. In the embodiment, the bottom of the plurality of trenches 4 exists further on the anode electrode 10 side than the bottom of the $p^-$-type anode layer 2.

The $p^+$-type diffusion layer 15 is provided so as to extend radially from the bottom of each trench 4 into the $n^-$-type active layer 1. The $p^+$-type diffusion layer 15 is formed by diffusing a p-type impurity from a portion of the $n^-$-type active layer 1 adjacent to the bottom of each trench 4. The concentration of the p-type impurity in the $p^+$-type diffusion layer 15 is high in the portion of the $n^-$-type active layer 1 adjacent to the bottom of each trench 4, and decreases with distance from this portion. The $p^+$-type diffusion layer 15 is joined to the $p^-$-type anode layer 2 along the trench 4, and protrudes from the $p^-$-type anode layer 2 toward the $n^-$-type active layer 1 in a convex manner. The concentration of the p-type impurity of a portion of the $p^+$-type diffusion layer 15 where the concentration of the p-type impurity is highest is higher than the concentration of the p-type impurity of a portion of the $p^-$-type anode layer where the concentration of the p-type impurity is highest.

In the embodiment, as described above, the bottom of the plurality of trenches 4 exists further on the anode electrode 10 side than the bottom of the $p^-$-type anode layer 2. However, the bottom of the plurality of trenches 4 may exist further on the cathode electrode side than the bottom of the $p^-$-type anode layer 2 to the extent that the $p^+$-type diffusion layer 15 is joined to the $p^-$-type anode layer 2.

The insulating film 5 is provided so as to cover the inner surface (the side surface and the bottom surface) of the plurality of trenches 4. The plurality of conductive bodies 6 are embedded in the plurality of trenches via the insulating film 5.

That is, the plurality of conductive bodies 6 are provided on the $p^-$-type anode layer 2 and the $p^+$-type diffusion layer 15 via the insulating film 5. The insulating film 5 is, for example, silicon oxide, but also silicon nitride, silicon oxynitride, or the like may be used. The conductive body 6 may be a conductive material, and is, for example, conductive polysilicon.

The $n^+$-type cathode layer 8 is provided so as to be electrically connected to the second surface of the $n^-$-type active layer 1. The concentration of the n-type impurity of the $n^+$-type cathode layer 8 is higher than the concentration of the n-type impurity of the $n^-$-type active layer. An n-type buffer layer may be provided between the $n^-$-type active layer 1 and the $n^+$-type cathode layer 8 as appropriate. In this case, the concentration of the n-type impurity of the n-type buffer layer is higher than the concentration of the n-type impurity of the $n^-$-type active layer 1, and is lower than the concentration of the n-type impurity of the $n^+$-type cathode layer 8.

The cathode electrode 9 is provided on a surface of the $n^+$-type cathode layer 8 on the opposite side to the $n^-$-type active layer 1 so as to be electrically connected to the $n^+$-type cathode layer 8. The anode electrode 10 is provided on the $p^-$-type anode layer 2 and on the plurality of conductive bodies 6, and is electrically connected to the $p^-$-type anode layer 2 and the plurality of conductive bodies 6.

Similarly to the PIN diode according to the first embodiment, also in the PIN diode according to the embodiment, a structure sandwiched by a pair of conductive bodies 6 provided in a pair of trenches 4 that are adjacent trenches 4 out of the plurality of trenches 4 mentioned above is defined as a unit cell. The unit cell is provided in plural on the first surface side of the $n^-$-type active layer 1. Thereby, a diode region (the first region) is formed.

Next, operations of the PIN diode according to the embodiment are described. The PIN diode according to the embodiment is, similarly to the PIN diode according to the first embodiment, a low injection-type diode in which the concentration of the p-type impurity of the $p^-$-type anode layer 2 is set low. However, the plurality of trenches 4 do not pass through the $p^-$-type anode layer 2 to reach the interior of the $n^-$-type active layer 1, and the bottom of the plurality of trenches 4 exists in the $p^+$-type diffusion layer 15.

When a negative voltage with respect to the cathode electrode 9 is applied to the anode electrode 10, a depletion layer spreads from the p-n junction between the $p^-$-type anode layer 2 and the $n^-$-type active layer 1 and the p-n junction between the $p^+$-type diffusion layer 15 and the $n^-$-type active layer 1 through the $n^-$-type active layer 1 toward the cathode electrode 9. Since the p-n junction between the $p^-$-type anode layer 2 and the $n^-$-type active layer 1 is parallel to the first surface and the second surface of the n⁻-type active layer 1, equipotential lines are distributed parallel to the p-n junction.

In contrast, the p-n junction between the p⁺-type diffusion layer 15 and the n⁻-type active layer 1 is convex toward the cathode electrode 9 side in a portion under the trench 4. Therefore, also equipotential lines are distributed in a convex manner. Furthermore, since the p⁺-type diffusion layer 15 has a higher p-type impurity concentration than the p⁻-type anode layer 2, the spacing between equipotential lines of the depletion layer spreading from the p⁺-type diffusion layer 15 into the n⁻-type active layer 1 is narrower than the spacing between equipotential lines of the depletion layer spreading from the p⁻-type anode layer 2 into the n⁻-type active layer 1.

Consequently, avalanche breakdown is more likely to occur in the p-n junction portion between the p⁺-type diffusion layer 15 and the n⁻-type active layer 1 than in the p-n junction portion between the p⁻-type anode layer 2 and the n⁻-type active layer 1. That is, the breakdown voltage is low. Since avalanche breakdown occurs almost simultaneously in portions under the trenches 4, the possibility is reduced that a current due to avalanche breakdown will be concentrated in a local portion to break the PIN diode. That is, the avalanche withstand capability of the PIN diode is high.

The embodiment has shown an example in which the p⁺-type diffusion layer 15 has a higher p-type impurity concentration than the bottom portion of the p⁻-type anode layer 2. However, the p⁺-type diffusion layer 15 is not limited thereto, and may have, for example, a p-type impurity concentration distribution almost identical to that of the p⁻-type anode layer 2 in the stacking direction. That is, also the case is possible where the concentration of the p-type impurity of the p⁺-type diffusion layer 15 is not clearly higher than the concentration of the p-type impurity of the bottom portion of the p⁻-type anode layer. Also in this case, since the p-n junction between the p⁺-type diffusion layer 15 and the n⁻-type active layer 1 is convex toward the cathode electrode 9 side under the trench 4, a portion where the spacing between equipotential lines is narrow is formed. Consequently, avalanche breakdown is likely to occur.

Here, similarly to what is described in the first embodiment, the effect is exhibited when the total amount of the p-type impurity per unit area of the p⁻-type anode layer 2 is $2 \times 10^{12}/cm^2$ or less, and the effect is more exhibited when the total amount of the p-type impurity per unit area is $1 \times 10^{12}/cm^2$ or less, which is more preferable. The effect of the invention is exhibited when the total amount of the p-type impurity per unit area of the p⁺-type diffusion layer 15 is equal to or more than the total amount of the p-type impurity per unit area of the p⁻-type anode layer 2.

In contrast, in a PIN diode that does not include the trench 4 and the p⁺-type diffusion layer 15 provided in a portion under the trench 4, the breakdown voltage of avalanche breakdown is high, but the portion where avalanche breakdown occurs does not exist in a large number and therefore a current due to avalanche breakdown is locally concentrated. Consequently, such a PIN diode has low avalanche withstand capability.

Thus, the PIN diode according to the embodiment includes the plurality of trenches 4 extending from a surface of the p⁻-type anode layer 2 on the opposite side to the n⁻-type active layer 1 into the p⁻-type anode layer 2, the conductive body 6 formed in each trench 4 via the insulating film 5 and electrically connected to the anode electrode 2, and the p⁺-type impurity diffusion layer 15 provided in a portion under each trench 4. Thereby, avalanche breakdown occurs evenly in the diode region in the p-n junction portions between the p⁺-type diffusion layers 15 provided in portions under the trenches 4 and the n⁻-type active layer 1, and local current concentration due to avalanche breakdown is suppressed. A low injection-type diode with high breakdown withstand capability can be provided.

Next, a method for forming the p⁺-type diffusion layer 15 of the power semiconductor device according to the embodiment is described using FIGS. 8A and 8B. FIGS. 8A and 8B are schematic cross-sectional views of a main portion of part of the manufacturing processes of the power semiconductor device according to the embodiment. As shown in FIG. 8A, a p-type impurity is ion-implanted into the first surface of the n⁻-type active layer 1, and heat treatment is performed. Thereby, the p⁻-type anode layer 2 is formed on the first surface of the n⁻-type active layer 1. Since the p-type anode layer 2 is a diffusion layer, the concentration of the p-type impurity is high on the opposite side to the n⁻-type active layer 1, and decreases with proximity to the n⁻-type active layer 1 side.

Next, by RIE (reactive ion etching) using a not-shown mask, the plurality of trenches 4 are formed so as to extend from a surface of the p⁻-type anode layer on the opposite side to the n⁻-type active layer into the p⁻-type anode layer 2. The trench 4 is formed such that the bottom of the trench 4 exists further on the anode electrode side than the bottom of the p⁻-type anode layer 2.

Next, the ion implantation of a p-type impurity is performed while the mask used for forming the trench 4 is left. Thereby, the p-type impurity is implanted only into a portion of the p⁻-type anode layer 2 or a portion of the n⁻-type active layer 1 adjacent to the bottom of each trench 4, and a p-type impurity injection layer 16 is formed adjacent to the bottom of each trench 4.

After that, as shown in FIG. 8B, heat treatment is performed to diffuse the p-type impurity; thus, the p⁺-type impurity diffusion layer 15 is formed adjacent to the bottom of each trench 4.

By the manufacturing method, even when the total p-type impurity amount in the ion implantation for forming the p⁻-type anode layer 2 and the total p-type impurity amount in the ion implantation for forming the p⁺-type diffusion layer 15 are substantially equal, the heat treatment for forming the p⁻-type anode layer 2 and the heat treatment for forming the p⁺-type diffusion layer 15 are separately performed. Therefore, the concentration of the p-type impurity of the p⁺-type diffusion layer 15 can be made higher than the concentration of the p-type impurity of the p⁻-type anode layer 2. That is, the concentration of the p-type impurity of the p⁺-type diffusion layer 15 can be controlled separately from that of the p⁻-type anode layer 2.

Next, another method for forming the p⁺-type diffusion layer 15 of the power semiconductor device according to the embodiment is described using FIG. 9. FIG. 9 is a schematic cross-sectional view of a main portion of part of the manufacturing processes of the power semiconductor device according to the embodiment.

As shown in FIG. 9, RIE is performed to form the plurality of trenches 4 extending from the first surface of the n⁻-type active layer 1 into the n⁻-type active layer 1. After that, a p-type impurity is implanted by ion implantation simultaneously into the first surface of the n⁻-type active layer 1 and into a portion of the n⁻-type active layer 1 exposed at the bottom of each trench 4. Thereby, the p-type impurity injection layer 16 is formed at the first surface of the n⁻-type active layer 1 and the bottom of the trench 4.

After that, heat treatment is performed to simultaneously form the p⁻-type anode layer 2 and the p⁺-type diffusion layer 15. The p-type impurity of the p-type impurity injection layer 16 is diffused until the p⁻-type anode layer 2 is connected to the p⁺-type diffusion layer 15.

By the manufacturing method, the concentration distribution in the stacking direction of the p-type impurity in the p⁻-type anode layer 2 and the concentration distribution in the stacking direction of the p-type impurity of the p⁺-type diffusion layer 15 are made almost the same. Therefore, the concentration of the p-type impurity of the p⁺-type diffusion layer 15 is almost the same as the concentration of the p-type impurity of the p⁻-type anode layer 2. However, a portion of the p⁺-type diffusion layer 15 where the concentration of the p-type impurity is highest is adjacent to the bottom portion of the p⁻-type anode layer 2, and the concentration of the p-type impurity of the bottom portion of the p⁻-type anode layer 2 is lower than the concentration of the p-type impurity of the portion of the p⁺-type diffusion layer 15 where the concentration of the p-type impurity is highest.

Fourth Embodiment

Figure 10:
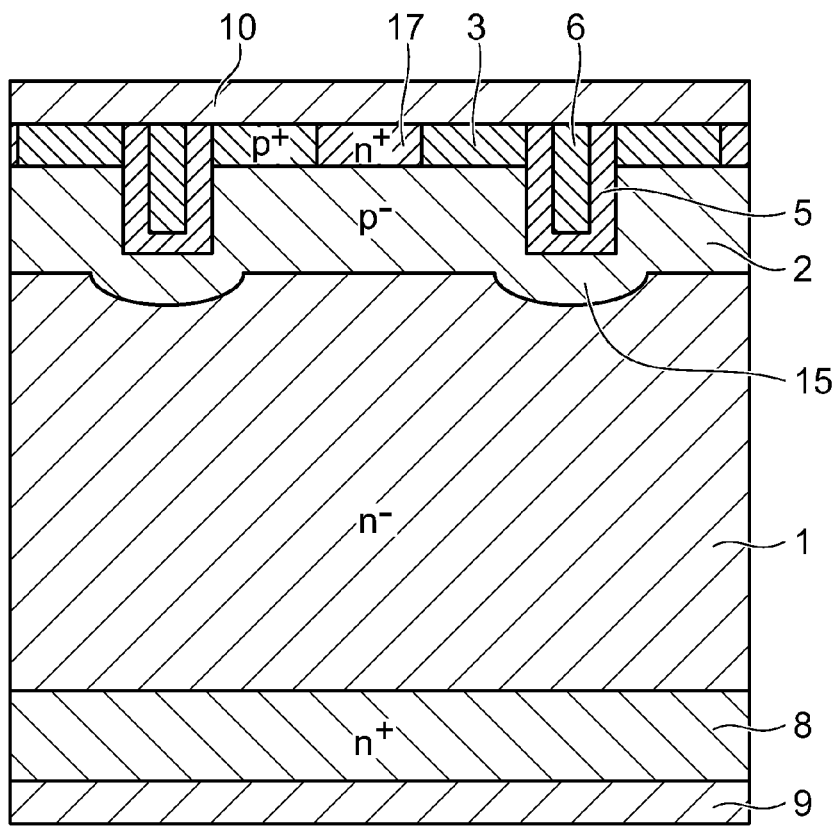
FIG. 10 is a schematic cross-sectional view of a main portion of a power semiconductor device according to a fourth embodiment.

A power semiconductor device according to a fourth embodiment will now be described using FIG. 10. FIG. 10 is a schematic cross-sectional view of a main portion of the power semiconductor device according to the fourth embodiment. Components of the same configuration as the configuration described in the third embodiment are marked with the same reference numerals or symbols, and a description thereof is omitted. Differences from the third embodiment are mainly described.

As shown in FIG. 10, a PIN diode according to the embodiment further includes the p⁺-type contact layer 3 made of a p-type semiconductor and an n⁺-type semiconductor layer 17 made of an n-type semiconductor on the surface on the opposite side to the n⁻-type active layer 1 of the p⁻-type anode layer 2 sandwiched between adjacent trenches 4 in the PIN diode according to the third embodiment. The p⁺-type contact layer 3 has a higher p-type impurity concentration than the p⁻-type anode layer 2, and is selectively provided on the surface on the opposite side to the n⁻-type active layer 1 of the p⁻-type anode layer 2 sandwiched between adjacent trenches 4. The p⁺-type contact layer 3 is, for example, provided adjacent to any of adjacent trenches, but is not limited thereto. The n⁺-type semiconductor layer 17 is selectively provided on the surface on the opposite side to the n⁻-type active layer 1 of the p⁻-type anode layer 2 sandwiched between adjacent trenches 4, and is adjacent to the p⁺-type contact layer 3. The PIN diode according to the embodiment differs from the PIN diode according to the third embodiment in the above respects.

Also the PIN diode according to the embodiment includes, similarly to the PIN diode according to the third embodiment, the plurality of trenches 4 extending from a surface of the p⁻-type anode layer 2 on the opposite side to the n⁻-type active layer 1 into the p⁻-type anode layer 2, the conductive body 6 formed in each trench 4 via the insulating film 5 and electrically connected to the anode electrode 2, and the p⁺-type impurity diffusion layer 15 provided in a portion under each trench 4. Thereby, avalanche breakdown occurs evenly in the diode region in the p-n junction portions between the p⁺-type diffusion layers 15 provided in portions under the trenches 4 and the n⁻-type active layer 1, and current concentration due to avalanche breakdown is suppressed. A low injection-type diode with high breakdown withstand capability can be provided.

Furthermore, in the embodiment, since the p⁺-type contact layer 3 is provided, the amount of holes injected from the anode side is increased to reduce the on-voltage of the FWD. The on-voltage is further reduced when the region occupied by the p⁺-type contact layer 3 is large in the surface on the opposite side to the n⁻-type active layer 1 of the p⁻-type anode layer 2 sandwiched by adjacent trenches 4. However, the effect of the low injection-type PIN diode is not obtained, and the reverse recovery characteristics of the PIN diode are degraded.

To cope with this, the n⁺-type semiconductor layer 17 is provided together with the p⁺-type contact layer 3 on the surface on the opposite side to the n⁻-type active layer 1 of the p⁻-type anode layer 2 sandwiched by adjacent trenches 4. The n⁺-type semiconductor layer 17 suppresses the injection of holes from the anode electrode 10 into the p⁻-type anode layer 2. When the region of the n⁺-type semiconductor layer 17 is increased in the surface on the opposite side to the n⁻-type active layer 1 of the p⁻-type anode layer 2 sandwiched by adjacent trenches 4, the effect of low injection is obtained, but at the same time the on-voltage is increased.

In the PIN diode according to the embodiment, a desired on-voltage and desired reverse recovery characteristics can be obtained by adjusting the area ratio between the n⁺-type semiconductor layer 17 and the p⁺-type contact layer 3 in the surface on the opposite side to the n⁻-type active layer 1 of the p⁻-type anode layer 2 sandwiched by adjacent trenches 4.

Fifth Embodiment

Figure 11:
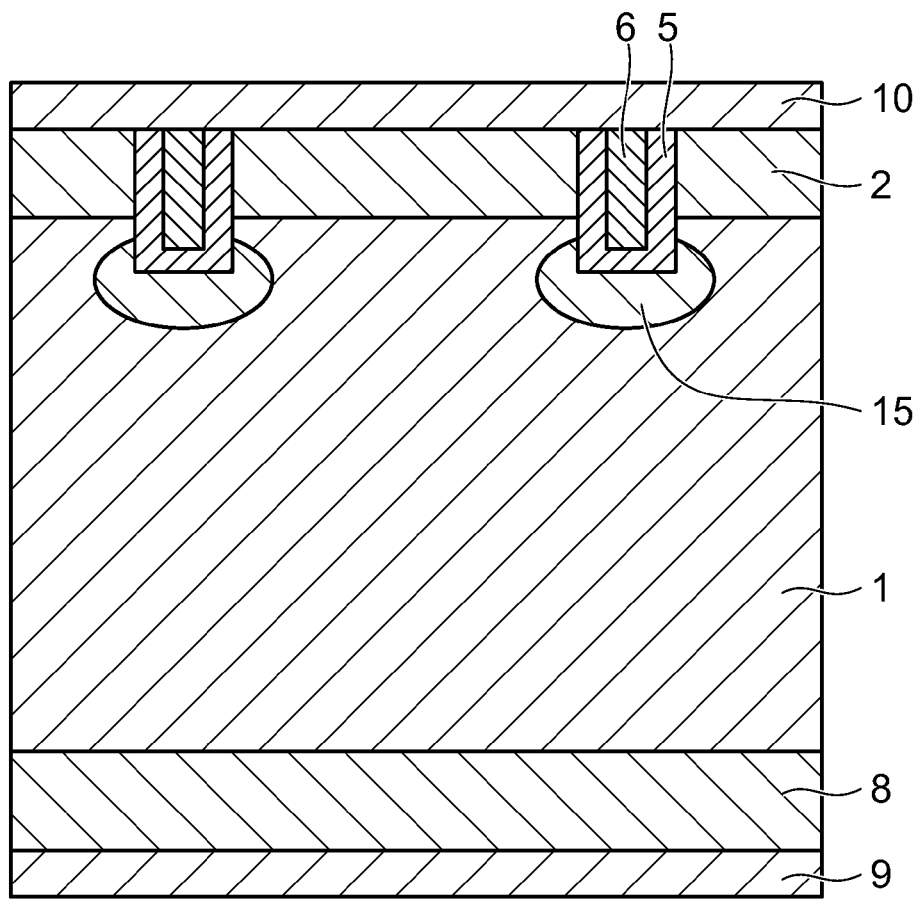
FIG. 11 is a schematic cross-sectional view of a main portion of a power semiconductor device according to a fifth embodiment.

A power semiconductor device according to a fifth embodiment will now be described using FIG. 11. FIG. 11 is a schematic cross-sectional view of a main portion of the power semiconductor device according to the fifth embodiment. Components of the same configuration as the configuration described in the third embodiment are marked with the same reference numerals or symbols, and a description thereof is omitted. Differences from the third embodiment are mainly described.

As shown in FIG. 11, the power semiconductor device according to the embodiment is a PIN diode in which the plurality of trenches 4 pass through the p⁻-type anode layer 2 to reach the interior of the n⁻-type active layer 1 in the PIN diode according to the third embodiment. The p⁺-type impurity diffusion layer 15 is provided in portions under the plurality of trenches 4. Similarly to the third embodiment, the p⁺-type impurity diffusion layer 15 spreads radially from a portion of the n⁻-type active layer adjacent to the bottom of each trench 4, and the concentration of the p-type impurity decreases with distance from that portion. The p⁺-type impurity diffusion layer 15 is away from the bottom of the p⁻-type anode layer 2 via the n⁻-type active layer 1. In the abode respects, the PIN diode according to the embodiment differs from the PIN diode according to the third embodiment.

In the PIN diode according to the embodiment, since the p⁺-type diffusion layer 15 is separated from the p⁻-type anode layer 2, holes are not injected into the n⁻-type active layer through the p⁺-type diffusion layer 15 when the PIN diode is in the on-state. Therefore, even when the p-type impurity concentration of the p⁺-type diffusion layer 15 is increased, there is no influence on the low injection effect of the PIN diode because the amount of holes injected into the n⁻-type active layer 1 is determined by the p-type impurity concentration of the p⁻-type anode layer 2.

By increasing the concentration of the p-type impurity of the p⁺-type impurity diffusion layer 15, the breakdown voltage of the p-n junction between the p⁺-type impurity diffusion layer 15 and the n⁻-type active layer 1 can be equally reduced in the diode region in portions under the trenches 4. Consequently, avalanche breakdown can be caused to occur evenly in a stable manner in the horizontal direction in the PIN diode, and therefore the avalanche withstand capability of the PIN diode can be improved.

Thus, also the PIN diode according to the embodiment includes, similarly to the PIN diode according to the third embodiment, the plurality of trenches 4 extending from a surface of the p⁻-type anode layer 2 on the opposite side to the n⁻-type active layer 1 into the p⁻-type anode layer 2, the conductive body 6 formed in each trench 4 via the insulating film 5 and electrically connected to the anode electrode 2, and the p⁺-type impurity diffusion layer 15 provided in a portion under each trench 4. Thereby, avalanche breakdown occurs evenly in the diode region in the p-n junction portions between the p⁺-type diffusion layers 15 provided in portions under the trenches 4 and the n⁻-type active layer 1, and current concentration due to avalanche breakdown is suppressed. A low injection-type diode with high breakdown withstand capability can be provided.

Furthermore, in the PIN diode according to the embodiment, the plurality of trenches 4 pass through the p⁻-type anode layer 2 to reach the interior of the n⁻-type active layer 1, and the p⁺-type diffusion layer 15 is away from the p⁻-type anode layer 2. Therefore, the low injection effect of the PIN diode is not suppressed even when the concentration of the p-type impurity of the p⁺-type diffusion layer 15 is increased to make avalanche breakdown more likely to occur evenly. Therefore, the embodiment provides a PIN diode with still higher avalanche withstand capability and good reverse recovery characteristics as compared to the PIN diode according to the third embodiment.

The plurality of trenches 4, the p⁺-type impurity diffusion layer 15, and the p⁻-type anode layer 2 of the PIN diode according to the embodiment can be formed by the processes of FIGS. 8A and 8B or FIG. 9, which are part of the manufacturing processes of the PIN diode according to the third embodiment. For example, the processes shown in FIG. 9 may be used when importance is attached to the efficiency of manufacturing processes, and the processes shown in FIGS. 8A and 8B may be used when the concentration of the p-type impurity of the p⁺-type diffusion layer 15 is controlled independently of that of the p⁻-type anode layer.

In the PIN diode according to the embodiment, the p⁻-type anode layer 2, the trench 4, and the p⁺-type diffusion layer 15 may be formed such that the p⁻-type anode layer 2 is extended further to the cathode electrode 9 side to reach the p⁺-type impurity diffusion layer 15. Thus, the PIN diode according to the embodiment becomes similar to the PIN diode according to the third embodiment. The formation of such a configuration may be performed by, for example, a method in which a diffusion layer of a p-type impurity for forming the p⁻-type anode layer 2 is formed deeply, a method in which the trench 4 is formed so as not to penetrate through the p⁻-type anode layer, or the like.

Sixth Embodiment

Figure 12:
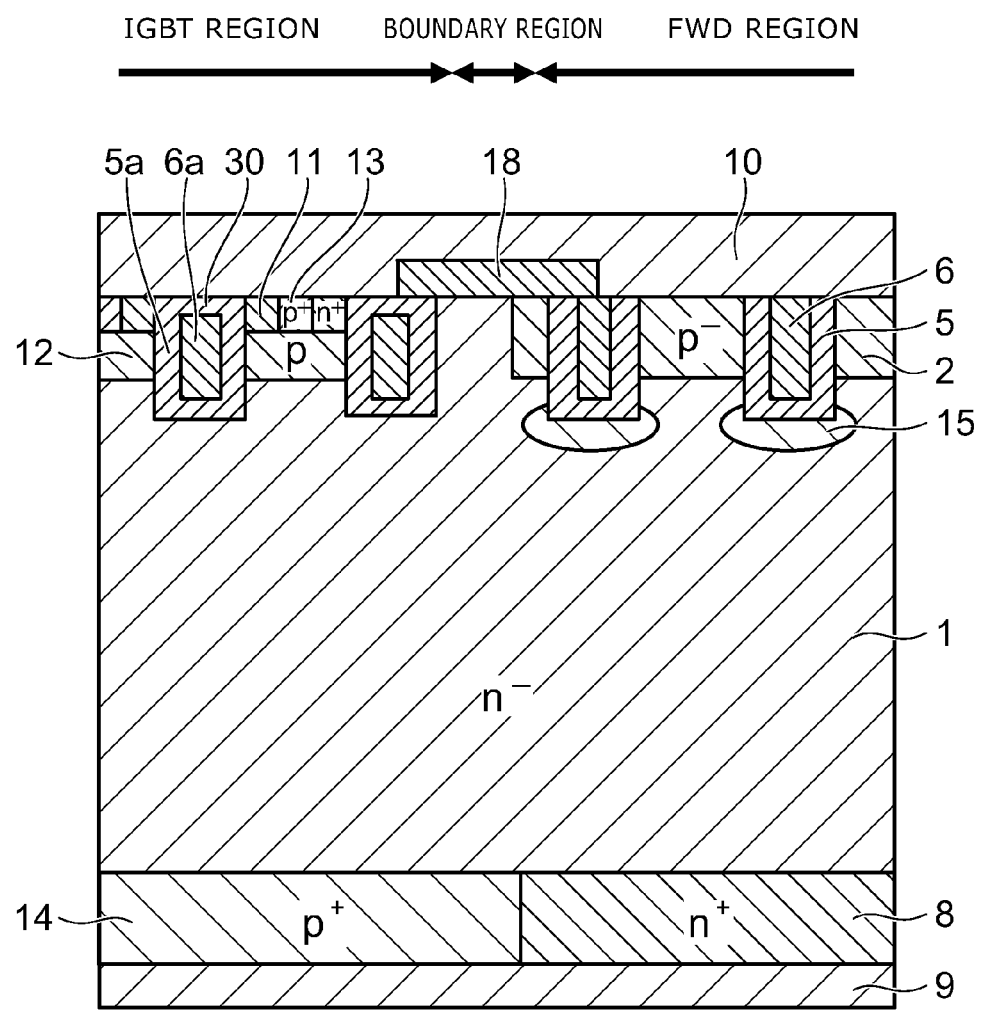
FIG. 12 is a schematic cross-sectional view of a main portion of a power semiconductor device according to a sixth embodiment.

A power semiconductor device according to a sixth embodiment will now be described using FIG. 12. FIG. 12 is a schematic cross-sectional view of a main portion of the power semiconductor device according to the sixth embodiment. Components of the same configuration as the configuration described in the fifth embodiment are marked with the same reference numerals or symbols, and a description thereof is omitted. Differences from the third embodiment are mainly described.

As shown in FIG. 12, the power semiconductor device according to the embodiment includes an FWD region in which a plurality of unit cells of an FWD are formed and an IGBT region in which a plurality of unit cells of an IGBT are formed. The FWD formed in the FWD region is the PIN diode according to the fifth embodiment. That is, the power semiconductor device according to the embodiment includes the PIN diode according to the fifth embodiment in the FWD region. The power semiconductor device according to the embodiment differs from the power semiconductor device according to the fifth embodiment in respect of further including the IGBT region.

In the power semiconductor device according to the embodiment, the n⁻-type active layer 1 includes the FWD region and the IGBT region adjacent thereto in a plane parallel to the first surface, which is the upper surface, or the second surface, which is the lower surface. The power semiconductor device according to the embodiment is an RC-IGBT. The structure of the FWD region is the same as the structure of the PIN diode according to the fifth embodiment, and the structure of the IGBT region is the same as the structure of the IGBT region of the second embodiment. Here, the p-type base layer 12 in the IGBT region contains a higher concentration p-type impurity than the p⁻-type anode layer 2 in the FWD region. In the RC-IGBT according to the embodiment, differing from the RC-IGBT according to the second embodiment, the n-type buffer layer 7 is omitted.

The FWD region and the IGBT region are adjacent to each other with a space between them via the n⁻-type active layer 1, which forms a boundary region. An interlayer insulating film 18 is provided on the first surface of the n⁻-type active layer 1 in the boundary region, and insulates the anode electrode 10 from the n⁻-type active layer 1. The interlayer insulating film 18 needs only to be provided at least between the anode electrode 10 and the first surface of the n⁻-type active layer 1, and may be provided further on the interlayer insulating film 30 in the IGBT region, or on a portion of the p⁻-type anode layer 2 or on the conductive body 6 in the FWD region.

The RC-IGBT according to the embodiment operates as follows, similarly to the RC-IGBT according to the second embodiment. When a voltage exceeding the threshold is applied to the gate electrode 6a of the IGBT, a channel layer is formed in a portion opposed to the gate electrode 6a of the p-type base layer 12, and the IGBT of the RC-IGBT is switched to the on-state. Consequently, a current flows through the IGBT from the collector electrode 9 toward the emitter electrode 10. When the voltage application to the gate electrode 6a is stopped, the channel disappears and the IGBT is switched to the off-state. At this time, when a positive voltage with respect to the collector electrode 9 is applied to the emitter electrode 10, the FWD becomes to be forward biased into the on-state, and a current flows from the anode electrode 10 toward the cathode electrode.

Also in the RC-IGBT according to the embodiment, the FWD formed in the FWD region has the same effects as the PIN diode according to the fifth embodiment. That is, the FWD formed in the FWD region of the RC-IGBT according to the embodiment includes the plurality of trenches 4 extending from a surface of the p⁻-type anode layer 2 on the opposite side to the n⁻-type active layer 1 into the p⁻-type anode layer 2, the conductive body 6 formed in each trench 4 via the insulating film 5 and electrically connected to the anode electrode 2, and the p⁺-type impurity diffusion layer 15 provided in a portion under each trench 4. Thereby, avalanche breakdown occurs evenly in the FWD region in the p-n junction portions between the p$^+$-type diffusion layers 15 provided in portions under the trenches 4 and the n$^-$-type active layer 1, and current concentration due to avalanche breakdown is suppressed. A low injection-type FWD with high breakdown withstand capability can be provided.

Furthermore, in the FWD of the RC-IGBT according to the embodiment, similarly to the PIN diode according to the fifth embodiment, the plurality of trenches 4 pass through the p$^-$-type anode layer 2 to reach the interior of the n$^-$-type active layer 1, and the p$^+$-type diffusion layer 15 is away from the p$^-$-type anode layer 2. Therefore, the low injection effect of the FWD is not suppressed even when the concentration of the p-type impurity of the p$^+$-type diffusion layer 15 is increased to make avalanche breakdown more likely to occur evenly. Therefore, the embodiment provides, similarly to the fifth embodiment, an FWD with still higher avalanche withstand capability and good reverse recovery characteristics as compared to the PIN diode according to the third embodiment.

Furthermore, similarly to the power semiconductor device according to the second embodiment, the power semiconductor device according to the embodiment has a feature in including the IGBT and the FWD according to the fifth embodiment which are collectively formed.

The RC-IGBT according to the embodiment improves the reverse recovery characteristics of the FWD by configuring the FWD to be a low injection type without including a lifetime control region in the FWD region, similarly to the RC-IGBT according to the second embodiment. Therefore, the IGBT in the RC-IGBT according to the embodiment has a low on-voltage similarly to the IGBT in the RC-IGBT according to the second embodiment.

Similarly to the RC-IGBT according to the second embodiment, the p-type base layer 12 in the IGBT region may be provided at the same depth as the p$^-$-type anode layer 2 in the FWD region, or may be provided shallower or deeper. The depths of them are set in accordance with the characteristics of the IGBT and the FWD. Similarly to the RC-IGBT according to the second embodiment, the depth of the plurality of trenches 4a in the IGBT region may be the same as or different from the depth of the plurality of trenches 4 in the FWD region. In the case where the depths of both are the same, the trench 4 in the FWD region and the trench 4a in the IGBT region can be collectively formed, and manufacturing efficiency is therefore increased.

The power semiconductor device according to the embodiment is an RC-IGBT including the FWD region, which is the first region, and the IGBT region, which is the second region. The embodiment is not limited thereto, and can be applied also to a power semiconductor device that includes a MOSFET region formed by a MOSFET (metal oxide semiconductor field effect transistor) as the second region in place of the IGBT region. In this case, instead of the p$^+$-type collector layer 14, the n$^+$-type cathode layer 8 in the first region extends to the second region, and is provided between the collector electrode 9 and the n$^-$-type base layer 1. The collector electrode 9 is electrically connected to the n$^-$-type base layer 1 via the n$^+$-type cathode layer 8.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power semiconductor device comprising:
    a first semiconductor layer of a first conductivity type;
    a second semiconductor layer of a second conductivity type provided on the first semiconductor layer;
    a pair of conductive bodies provided in the second semiconductor layer via an insulating film;
    a third semiconductor layer of the second conductivity type selectively provided on the second semiconductor layer;
    a first electrode provided on the pair of conductive bodies, the first electrode being electrically connected to the pair of conductive bodies; and
    a second electrode electrically connected to the first semiconductor layer,
    wherein the second semiconductor layer includes a region of the second conductivity type provided under one of the pair of conductive bodies, the region of the second conductivity type being connected to the second semiconductor layer between the pair of conductive bodies,
    wherein a total second conductivity type impurity amount per unit area of the second semiconductor layer is $2 \times 10^{12}/cm^2$ or less,
    wherein a distance between the pair of conductive bodies via the insulating film is 2 µm or less,
    wherein the first semiconductor layer includes a first region and a second region adjacent to the first region, and the second semiconductor layer, the pair of conductive bodies, and the third semiconductor layer are provided on the first semiconductor layer in the first region,
    wherein the device further includes:
        a fifth semiconductor layer of the second conductivity type, the fifth semiconductor layer being provided on the first semiconductor layer in the second region, and the fifth semiconductor layer having a higher second conductivity type impurity concentration than the second semiconductor layer;
        a sixth semiconductor layer of the first conductivity type, the sixth semiconductor layer being selectively provided on the fifth semiconductor layer, and the sixth semiconductor layer having a higher first conductivity type impurity concentration than the first semiconductor layer; and
        a gate electrode provided on the first semiconductor layer in the second region, the fifth semiconductor layer, and the sixth semiconductor layer via a gate insulating film, and
    wherein the first electrode is electrically connected to the fifth semiconductor layer and the sixth semiconductor layer.

2. The device according to claim 1, wherein the second semiconductor layer is in schottky contact with the first electrode.

3. The device according to claim 1, wherein a ratio of A to B is smaller than or equal to 0.5, where A is the distance between the pair of conductive bodies via the insulating film and B is a depth of the insulating film and one of the pair of conductive bodies.

4. The device according to claim 1, wherein the gate electrode extends from a surface of the sixth semiconductor layer through the fifth semiconductor layer to the first semiconductor layer via the gate insulating film.

5. The device according to claim 4, wherein a depth of one of the conductive bodies and the insulating film is the same as a depth of the gate electrode and the gate insulating film.

6. The device according to claim 1, further comprising an eighth semiconductor layer of the second conductivity type, the eighth semiconductor layer being electrically connected to the first semiconductor layer in the second region, and the eighth semiconductor layer having a higher second conductivity type impurity concentration than the fifth semiconductor layer,
   wherein the second electrode is electrically connected to the first semiconductor layer via the eighth semiconductor layer in the second region.

7. The device according to claim 1, wherein the third semiconductor layer is provided between the pair of conductive bodies.

8. The device according to claim 1, wherein a portion of the second semiconductor layer is provided between the third semiconductor layer and each of the pair of conductive bodies.

9. A power semiconductor device comprising:
   a first semiconductor layer of a first conductivity type, the first semiconductor layer including a first region and a second region adjacent to the first region;
   a second semiconductor layer of a second conductivity type, the second semiconductor layer being provided on the first semiconductor layer in the first region;
   a pair of conductive bodies provided in the first semiconductor layer and the second semiconductor layer via an insulating film, the pair of conductive bodies being adjacent to the second semiconductor layer via the insulating film;
   an impurity diffusion layer of the second conductivity type, the impurity diffusion layer being provided under the pair of conductive bodies;
   a fifth semiconductor layer of the second conductivity type, the fifth semiconductor layer being provided on the first semiconductor layer in the second region, and the fifth semiconductor layer having a higher second conductivity type impurity concentration than the second semiconductor layer;
   a sixth semiconductor layer of the first conductivity type, the sixth semiconductor layer being selectively provided on the fifth semiconductor layer, and the sixth semiconductor layer having a higher first conductivity type impurity concentration than the first semiconductor layer;
   a gate electrode provided on the first semiconductor layer in the second region, the fifth semiconductor layer, and the sixth semiconductor layer via a gate insulating film;
   a first electrode provided on the pair of conductive bodies, the fifth semiconductor layer, and the sixth semiconductor layer, the first electrode being electrically connected to the pair of conductive bodies, the fifth semiconductor layer, and the sixth semiconductor layer; and
   a second electrode electrically connected to the first semiconductor layer.

10. The device according to claim 9, wherein the impurity diffusion layer is formed by ion-implanting a second conductivity type impurity into a portion of the first semiconductor layer adjacent to a bottom of the pair of conductive bodies via the insulating film.

11. The device according to claim 9, wherein the impurity diffusion layer protrudes further to the first semiconductor layer side than a bottom of the second semiconductor layer.

12. The device according to claim 9, wherein the impurity diffusion layer is connected to the second semiconductor layer along a side wall of the pair of conductive bodies via the insulating film.

13. The device according to claim 9, wherein the impurity diffusion layer is away from the second semiconductor layer via the first semiconductor layer.

14. The device according to claim 9, further comprising a third semiconductor layer of the second conductivity type, the third semiconductor layer being selectively provided on the second semiconductor layer between the pair of conductive bodies,
   wherein a second conductivity type impurity concentration in a surface of the third semiconductor layer is higher than a second conductivity type impurity concentration in a surface of the second semiconductor layer,
   wherein a total second conductivity type impurity amount per unit area of the third semiconductor layer is larger than a total second conductivity type impurity amount per unit area of the second semiconductor layer, and
   wherein the first electrode is electrically connected to the third semiconductor layer.

15. The device according to claim 14, further comprising a seventh semiconductor layer of the first conductivity type, the seventh semiconductor layer being selectively provided on the second semiconductor layer between the pair of conductive bodies, the seventh semiconductor layer having a higher first conductivity type impurity concentration than the first semiconductor layer, and the seventh semiconductor layer being adjacent to the third semiconductor layer.

16. The device according to claim 15, wherein the third semiconductor layer is provided between the seventh semiconductor layer and each of the pair of conductive bodies.

17. The device according to claim 9, wherein the gate electrode extends from a surface of the sixth semiconductor layer through the fifth semiconductor layer to the first semiconductor layer via the gate insulating film.

18. The device according to claim 17, wherein a depth of one of the conductive bodies and the insulating film is the same as a depth of the gate electrode and the gate insulating film.

19. The device according to claim 9, further comprising an eighth semiconductor layer of the second conductivity type, the eighth semiconductor layer being electrically connected to the first semiconductor layer in the second region, and the eighth semiconductor layer having a higher second conductivity type impurity concentration than the fifth semiconductor layer,
   wherein the second electrode is electrically connected to the first semiconductor layer via the eighth semiconductor layer in the second region.

* * * * *